(12) United States Patent
Guo et al.

(10) Patent No.: US 8,661,304 B2
(45) Date of Patent: Feb. 25, 2014

(54) TEST PATTERN GENERATION FOR DIAGNOSING SCAN CHAIN FAILURES

(71) Applicant: Mentor Graphics Corporation, Wilsonville, OR (US)

(72) Inventors: Ruifeng Guo, Portland, OR (US); Wu-Tung Cheng, Lake Oswego, OR (US); Yu Huang, Sudbury, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/681,182

(22) Filed: Nov. 19, 2012

(65) Prior Publication Data

US 2013/0080849 A1 Mar. 28, 2013

Related U.S. Application Data

(63) Continuation of application No. 12/471,227, filed on May 22, 2009, now Pat. No. 8,316,265, which is a continuation-in-part of application No. 12/074,162, filed on Feb. 29, 2008, now Pat. No. 8,261,142.

(60) Provisional application No. 61/120,388, filed on Dec. 5, 2008, provisional application No. 60/905,014, filed on Mar. 4, 2007, provisional application No. 60/981,406, filed on Oct. 19, 2007.

(51) Int. Cl.
*G01R 31/28* (2006.01)
(52) U.S. Cl.
USPC .......................................................... 714/726
(58) Field of Classification Search
USPC ........................................ 714/726, 727, 729
See application file for complete search history.

(56) References Cited

U.S. PATENT DOCUMENTS

| | | | |
|---|---|---|---|
| 5,881,067 A | 3/1999 | Narayanan et al. | |
| 5,996,101 A | 11/1999 | Masumoto | |
| 6,308,290 B1 | 10/2001 | Forlenza et al. | |
| 6,490,702 B1 | 12/2002 | Song et al. | |
| 6,694,454 B1 | 2/2004 | Stanley | |
| 6,961,886 B2 | 11/2005 | Motika et al. | |
| 6,996,791 B2 | 2/2006 | Brunkhorst et al. | |
| 6,998,866 B1 * | 2/2006 | Bazan et al. | 324/762.02 |
| 7,010,735 B2 | 3/2006 | Motika et al. | |
| 7,107,502 B2 | 9/2006 | Burdine | |
| 7,139,948 B2 | 11/2006 | Rearick et al. | |
| 7,225,374 B2 * | 5/2007 | Burdine et al. | 714/726 |
| 7,234,090 B2 * | 6/2007 | Blasi et al. | 714/726 |
| 7,239,978 B2 | 7/2007 | Cheng et al. | |
| 7,240,261 B2 * | 7/2007 | Huisman et al. | 714/726 |
| 7,392,448 B2 | 6/2008 | De Poorter et al. | |

(Continued)

OTHER PUBLICATIONS

Crouch, "Debugging and Diagnosing Scan Chains," *EDFAS*, vol. 7, pp. 16-24 (Feb. 2005).

(Continued)

*Primary Examiner* — James C Kerveros
(74) *Attorney, Agent, or Firm* — Klarquist Sparkman, LLP

(57) ABSTRACT

Embodiments of the disclosed technology comprise techniques that can be used to generate scan chain test patterns and improve scan chain failure diagnosis resolution. For example, certain embodiments can be used to generate high quality chain diagnosis test patterns that are able to isolate a scan chain defect to a single scan cell. At least some embodiments can be used to locate faults over multiple capture cycles in the scan chain.

13 Claims, 32 Drawing Sheets

(56) References Cited

U.S. PATENT DOCUMENTS

| | | | |
|---|---|---|---|
| 7,395,469 B2* | 7/2008 | Anderson et al. | 714/726 |
| 7,426,448 B2* | 9/2008 | Song et al. | 702/117 |
| 7,496,816 B2 | 2/2009 | Bartenstein et al. | |
| 7,568,139 B2 | 7/2009 | Dokken et al. | |
| 7,574,644 B2 | 8/2009 | Forlenza et al. | |
| 7,650,547 B2 | 1/2010 | Burlison et al. | |
| 8,261,142 B2 | 9/2012 | Guo et al. | |
| 8,316,265 B2 | 11/2012 | Guo et al. | |
| 2005/0229057 A1 | 10/2005 | Anderson et al. | |
| 2007/0043989 A1 | 2/2007 | Yokota | |
| 2008/0215943 A1 | 9/2008 | Guo et al. | |
| 2009/0235134 A1 | 9/2009 | Guo et al. | |
| 2012/0216088 A1 | 8/2012 | Guo et al. | |

OTHER PUBLICATIONS

De et al., "Failure Analysis for Full-Scan Circuits," *Proc. ITC*, pp. 636-645 (1995).

Edirisooriya et al., "Diagnosis of Scan Path Failures," *Proc. VLSI Test Symp.*, pp. 250-255 (1995).

Goldstein, "Controllability/Observability Analysis of Digital Circuits," IEEE Transactions on Circuits and Systems, vol. CAS-26, No. 9, 9 pp. (Sep. 1979).

Guo et al., "A Complete Test Set to Diagnose Scan Chain Failures," *Proc. ITC*, 1- pp., (2007).

Guo et al., "A Technique for Fault Diagnosis of Defects in Scan Chains," *Proc. ITC*, pp. 268-277 (2001).

Guo et al., "An algorithmic technique for diagnosis of faulty scan chains," *IEEE Trans. CAD*, pp. 1861-1868 (Sep. 2006).

Hirase et al., "Scan Chain Diagnosis using IDDQ Current Measurement," *Proc. Asian Test Symp.*, pp. 153-157 (1999).

Huang et al., "Compressed Pattern Diagnosis for Scan Chain Failures," *Proc. ITC*, 8 pp. (2005).

Huang et al., "Diagnosis with Limited Failure Information," *Proc. ITC*, paper 22.2, 10 pp. (2006).

Huang et al., "Statistical Diagnosis for Intermittent Scan Chain Hold-Time Fault," *Proc. ITC*, pp. 319-328 (2003).

Huang et al., "Using Fault Model Relaxation to Diagnose Real Scan Chain Defects," *DAC*, pp. 1176-1179 (2005).

Hwang et al., "Deterministic Localization and Analysis of Scan Hold-Time Faults," *Int'l Symp. on Test and Failure Analysis*, pp. 396-401, (Nov. 2008).

Kong et al., "Diagnosis of Multiple Scan Chain Faults," *Int'l Symp. for Testing and Failure Analysis*, pp. 510-516 (Nov. 2005).

Kundu, "Diagnosing Scan Chain Faults," *IEEE Trans. VLSI Systems*, vol. 2, No. 4, pp. 512-516 (Dec. 1994).

Li, "Diagnosis of Multiple Hold-Time and Setup-Time Faults in Scan Chains," *IEEE TC*, vol. 54, No. 11, pp. 1467-1472 (Nov. 2005).

Li, "Diagnosis of Single Stuck-at Faults and Multiple Timing Faults in Scan Chains," *IEEE Trans. VLSI Systems*, vol. 13, No. 6, pp. 708-718 (Jun. 2005).

Narayanan et al., "An Efficient Scheme to Diagnose Scan Chains," *Proc. ITC*, pp. 704-713 (1997).

Office action dated May 17, 2010, from U.S. Appl. No. 12/074,162.

Rajski et al., "Embedded Deterministic Test for Low Cost Manufacturing Test," *Proc. ITC*, pp. 301-310 (2002).

Schafer et al., "Partner SRLs for Improved Shift Register Diagnostics," *Proc. VLSI Test Symp.*, pp. 198-201 (1992).

Song et al., "A Novel Scan Chain Diagnostics Technique Based on Light Emission from Leakage Current," *Proc. ITC*, pp. 140-147 (2004).

Song et al., "Diagnosis and Failure Analysis for Scan Failure," *Proc. 12th IPFA*, pp. 181-184, (2005).

Song et al., "Diagnostic techniques for the IBM S/390 600MHz G5 Microprocessor," *Proc. ITC*, pp. 1073-1082 (1999).

Stanley, "High-Accuracy Flush-and-Scan Software Diagnostic," *IEEE Workshop on Yield Optimization & Test*, pp. 56-62 (Oct. 2000).

Stellari et al., "Broken Scan Chain Diagnostics based on Time-Integrated and Time-Dependent Emission Measurements," *Proc. ISTFA*, pp. 52-57, (2004).

Wang et al., "Deterministic Diagnostic Pattern Generation (DDPG) for Compound Defects," *Proc. ITC*, 10 pp. (2008).

Wu, "Diagnosis of Scan Chain Failures," *Proc. Int'l Symp. on Defect and Fault Tolerance in VLSI Systems*, pp. 217-222 (1998).

Yang et al., "Quick Scan Chain Diagnosis Using Signal Profiling," *ICCD*, 4 pp. (2005).

\* cited by examiner

TEST PATTERN GENERATION FOR DIAGNOSING SCAN CHAIN FAILURES

CROSS-REFERENCE TO RELATED APPLICATIONS

This application is a continuation of U.S. patent application Ser. No. 12/471,227, now U.S. Pat. No. 8,316,265, entitled "TEST PATTERN GENERATION FOR DIAGNOSING SCAN CHAIN FAILURES" and filed May 22, 2009, which claims the benefit of U.S. Provisional Application No. 61/120,388, titled "DIAGNOSTIC TEST GENERATION FOR CHAIN FAILURES USING SEQUENTIAL PATTERNS" and filed Dec. 5, 2008, and which also is a continuation-in-part of U.S. patent application Ser. No. 12/074,162, now U.S. Pat. No. 8,261,142, titled "GENERATING TEST SEETS FOR DIAGNOSING SCAN CHAIN FAILURES" and filed Feb. 29, 2008, which claims the benefit of the U.S. Provisional Application No. 60/905,014, titled "GENERATING TEST SETS FOR DIAGNOSING SCAN CHAIN FAILURES" AND FILED Mar. 4, 2007, and U.S. Provisional Application No. 60/981,406, titled "GENERATING TEST SETS FOR DIAGNOSING SCAN CHAIN FAILURES" and filed Oct. 19, 2007, all of which are hereby incorporated herein by reference.

FIELD

This application relates generally to the field of testing integrated circuits, and, more specifically, to the field of generating test patterns for diagnosing scan chain failures.

BACKGROUND

Scan-chain-based design is a design-for-test (DFT) technique for testing large electronic circuits (e.g., VLSI circuits). In general, scan-chain-based designs improve the testability of a circuit and hence can reduce the time for test generation and test application. Furthermore, because internal state elements are more easily observed and controlled in scan-chain-based designs, scan-chain-based diagnosis techniques can improve the efficiency and effectiveness of identifying the root cause of one or more logic failures in a circuit. Thus, scan-chain-based logic diagnosis can be used to help accelerate product yield analysis and ramp up.

Scan-chain-based logic diagnosis typically assumes that the scan chains of a design are working properly. However, scan chain failures can be an issue for yield analysis and product ramp up. For example, a defect in a scan chain can cause wrong values to be captured into or shifted out of a scan cell.

Conventional scan chain fault diagnosis techniques can be classified into three categories: tester-based, hardware-based, and software-based diagnosis techniques. In general, tester-based diagnosis techniques use a tester to control the test conditions and load values that are loaded into a faulty scan chain. By observing the defective responses from different test conditions, failing scan cells can be identified. Tester-based diagnosis techniques, however, are usually very time-consuming. Hardware-based diagnosis techniques typically involve modifying conventional scan chains to help isolate failing scan cells. Hardware-based diagnosis techniques can be effective in isolating scan chain defects, but these techniques require specially designed scan chains with extra hardware overhead. Software-based techniques use algorithmic diagnosis procedures to identify failing scan cells. In general, software-based diagnosis techniques do not require special scan chains and can be applied to general scan designs.

Successful scan chain fault diagnosis is dependent in part on the number of tester failures collected for a failing chip. In practice, production test patterns are often used to collect tester failures for scan chain and logic failure diagnosis. Regular production test patterns typically focus on a pass/fail evaluation of a circuit under test, however, and are not optimized for diagnosis purposes. For example, statistics on chain diagnosis for more than 100 die with failing chains have shown that with production scan test patterns, only about 23% of the scan chain diagnosis cases produce fewer than three scan cell candidates.

Accordingly, there is a need to improve scan chain diagnosis by generating and using higher-quality test patterns for detecting scan chain failures.

SUMMARY

Embodiments of the disclosed technology comprise techniques that can be used to generate scan chain test patterns and improve scan chain failure diagnosis resolution. For example, certain embodiments can be used to generate high quality chain diagnosis test patterns that are able to isolate a scan chain defect to a single scan cell. At least some embodiments can be used to locate faults over multiple capture cycles in the scan chain.

In some embodiments, a computer-implemented method comprises: generating one or more scan chain test patterns for detecting a fault in a scan chain in an electronic circuit, wherein the one or more scan chain test patterns are generated based at least in part on a description of one or more load value constraints for a first set of one or more scan cells in the scan chain, and based at least in part on a description of one or more capture value constraints for a second set of one or more scan cells in the scan chain for a plurality of capture cycles; and storing the one or more scan chain test patterns on a tangible computer-readable storage medium. The method sometimes further comprises: applying the generated one or more scan chain test patterns to the scan chain in the electronic circuit; identifying a range of suspect scan cells in the scan chain using the one or more scan chain test patterns; and storing a description of the identified range of suspect scan cells in one or more computer-readable storage media. In some cases, the identified range of suspect scan cells comprises exactly one scan cell. In some embodiments, the one or more load value constraints for the first set of one or more scan cells comprise non-fault activating values for the fault. In further embodiments, the one or more capture value constraints for the second set of one or more scan cells comprise constraining a targeted scan cell in the second set to an X value for the plurality of capture cycles. The one or more scan chain test patterns are sometimes configured to produce a fault-activating value on an input of a scan cell directly downstream from the targeted scan cell. The one or more scan chain test patterns are sometimes configured to produce a fault-activating value on an input of a scan cell downstream from the targeted scan cell. In some cases the one or more capture value constraints for the second set of one or more scan cells comprise constraining a first selected scan cell to an X value for the plurality of capture cycles, and wherein the one or more scan chain test patterns are generated based further on one or more unload constraints for a third set of one or more scan cells, the one or more unload constraints comprising constraining a second selected scan cell and its respective upstream scan cells as unobservable during scan unload of the third set of one or more scan cells. In particular embodiments, the scan chain is a first scan chain, and the one or more scan chain test patterns are configured to cause the output of a targeted scan cell to be propagated to a second scan chain, to a primary output, or to a scan cell in the scan chain outside of the first and second sets of one or more scan cells. In some cases the electronic circuit comprises compression hardware for compacting test responses, and the method further comprises accounting, during test pattern generation, for transformations caused by the compression hardware.

In additional embodiments, a computer-implemented method comprises generating one or more scan chain test patterns for locating a faulty scan cell in a scan chain in an electronic circuit by capturing a fault effect of the faulty scan cell after a plurality of capture cycles. Sometimes the method further comprises applying at least some of the generated one or more patterns to the electronic circuit to identify a range of one or more scan cell candidates containing the faulty scan cell. In some cases the faulty scan cell has a stuck-at fault or a timing fault (e.g., one of a slow-to-rise fault, a slow-to-fall fault, a slow fault, a hold-time fault, a fast-to-rise fault, a fast-to-fall fault, and a fast fault). In some cases a first of the one or more scan chain test patterns is generated according to a first test pattern generation method, and a second of the one or more scan chain test patterns is generated according to a second test pattern generation method.

In further embodiments, a computer-implemented method comprises: generating one or more scan chain test patterns for detecting a timing fault in a scan chain in an electronic circuit, wherein the one or more scan chain test patterns are generated based at least in part on a description of one or more constant load value constraints for a first set of one or more scan cells in the scan chain, a description of one or more capture value constraints for a second set of one or more scan cells in the scan chain for one or more capture cycles, and a description of one or more capture value constraints for the second set of one or more scan cells in the scan chain for a last capture cycle, wherein the one or more scan chain test patterns are configured to produce a non-fault-activating value on the input of a selected scan cell in the second set of scan cells and a fault-activating value on an input of a scan cell directly downstream from the selected scan cell; and storing the generated one or more scan chain test patterns in one or more computer-readable storage media. In some cases, the one or more capture value constraints for the second set of one or more scan cells for the one or more capture cycles comprise constraining the selected scan cell to an X value. In further embodiments the method comprises applying the generated one or more scan chain test patterns to the scan chain.

In additional embodiments, a computer-implemented method comprises: performing a first test pattern generation technique targeting a possible fault at a selected scan cell in a faulty scan chain, wherein the first test pattern generation technique is configured to attempt to generate a first test pattern that uses a first plurality of capture cycles to detect the possible fault at the targeted scan cell; and performing a second test pattern generation technique targeting the possible fault at the selected scan cell in the faulty scan chain, wherein the second test pattern generation technique is configured to generate a test pattern that uses a second plurality of capture cycles to detect the possible fault at the targeted scan cell. Sometimes the method further comprises determining that performing the first test pattern generation technique did not successfully generate the first test pattern, and the second test pattern generation technique is performed as a result of the determining. Sometimes the method further comprises performing a third test pattern generation technique targeting the possible fault at the selected scan cell in the faulty scan chain, wherein the third test pattern generation technique generates one or more test patterns that differentiate the selected scan cell from one or more other scan cells in the faulty scan chain using fault propagation.

In further embodiments, a computer-implemented method comprises: at a server computer, receiving a download request from a remote computer; and transmitting computer-readable instructions to the remote computer in response to the download request, the computer-readable instructions being instructions which, when executed by a computer, reconfigure the computer to generate one or more scan chain test patterns for detecting a fault in a scan chain in an electronic circuit, wherein the one or more scan chain test patterns are generated based at least in part on a description of one or more load value constraints for a first set of one or more scan cells in the scan chain and based at least in part on a description of one or more capture value constraints for a second set of one or more scan cells in the scan chain for a plurality of capture cycles.

In some cases, one or more computer-readable storage media store instructions which, when executed by a computer, reconfigure the computer to perform one or more methods disclosed herein. In further embodiments, one or more computer-readable storage media store the results of one or more methods disclosed herein.

The foregoing and other features of the disclosed technologies will become more apparent from the following detailed description, which proceeds with reference to the accompanying figures.

DETAILED DESCRIPTION

I. General Considerations

Figure 1:
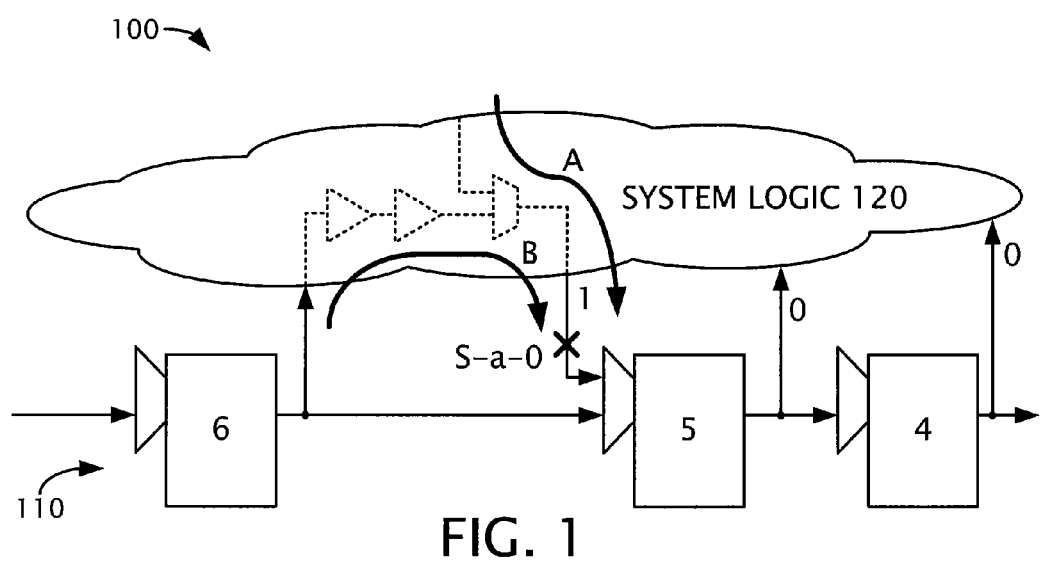
FIG. 1 is a schematic block diagram illustrating a stuck-at-0 fault in a faulty scan chain and two possible paths for propagating a value exciting the fault.

Disclosed below are representative embodiments of methods, apparatus, and systems for performing test pattern generation and fault diagnosis that should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved. The methods disclosed herein are not performed purely in the human mind.

In certain embodiments, test pattern generation techniques are described that can be used to improve scan chain failure diagnosis resolution. In particular embodiments, a test set that guarantees that each defective scan cell has a unique failing behavior is generated. In certain embodiments of the disclosed technique, test sets based on stuck-at fault and/or timing fault models are generated. Embodiments of the test set generation techniques described herein can be applied to situations where multiple failing scan chains might exist as well to designs with embedded scan compression logic. Experimental results showing the effectiveness of exemplary embodiments are also presented.

Any of the methods, apparatus, manufactures, and systems described herein can be used in conjunction with a wide variety of scan-based or partially-scan-based circuits and in connection with a wide variety of diagnostic procedures. Further, the fault types identified using test sets generated according to the disclosed techniques need not be of a particular type, but can vary from implementation to implementation (e.g., stuck-at faults, transition faults, hold-time faults, and other faults). For illustrative purposes only, however, many of the examples described herein are explained in the context of generating test sets for detecting stuck-at and timing faults (such as transition faults).

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the figures may not show the various ways in which the disclosed methods, apparatus, manufactures, and systems can be used in conjunction with other methods, apparatus, manufactures, and systems. Additionally, the description sometimes uses terms like "determine," "identify," and "constrain" to describe the disclosed technology. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not altering the intended operation of the circuit. The phrase "and/or" means "one or more of" the elements described in the sentence.

The disclosed embodiments can be implemented in a wide variety of environments. For example, embodiments of the disclosed methods can be performed by software stored on one or more tangible computer-readable media (e.g., one or more optical media discs, volatile memory or storage components (such as DRAM or SRAM), or nonvolatile memory or storage components (such as hard drives)) and executed on a computer. Such software can comprise, for example, an electronic-design-automation ("EDA") tool (e.g., an automatic test pattern generation ("ATPG") tool) used to generate test patterns for testing one or more circuits (e.g., an application specific integrated circuit ("ASIC"), a programmable logic device ("PLD") such as a field-programmable gate array ("FPGA"), or a system-on-a-chip ("SoC") having digital, analog, or mixed-signal components thereon). Such software can also comprise, for example, EDA software used to diagnose test responses to chain diagnosis test patterns applied to the one or more circuits. These particular software implementations should not be construed as limiting in any way, however, as the principles disclosed herein are generally applicable to other software tools. Such software can be executed on a single computer or on a networked computer (e.g., via the Internet, a wide-area network, a local-area network, a client-server network, or other such network).

The software embodiments disclosed herein can be described in the general context of computer-executable instructions, such as those included in program modules, which can be executed in a computing environment on a target real or virtual processor. Generally, program modules include routines, programs, libraries, objects, classes, components, data structures, etc., that perform particular tasks or implement particular abstract data types. The functionality of the program modules can be combined or split between program modules as desired in various embodiments. Computer-executable instructions for program modules can be executed within a local or distributed computing environment. For clarity, only certain selected aspects of the software-based implementations are described. Other details that are well known in the art are omitted. For example, it should be understood that the disclosed technology is not limited to any specific computer language, program, or computer. For instance, the disclosed embodiments can be implemented using a wide variety of commercially available computer systems and/or testing systems. Any of the disclosed methods can alternatively be implemented (partially or completely) in hardware (e.g., an ASIC, PLD, or SoC).

Additionally, any test pattern or diagnostic result (including any intermediate or partial test pattern or diagnostic result), as well as any other intermediate or final result, created or modified using any of the disclosed methods can be stored on a tangible computer-readable storage medium (e.g., one or more optical media discs, volatile memory or storage components (such as DRAM or SRAM), or nonvolatile memory or storage components (such as hard drives)).

Furthermore, any of the software embodiments (comprising, for example, computer-executable instructions for causing a computer to perform any of the disclosed methods) can be transmitted, received, or accessed through a suitable communication means. Similarly, any test pattern or diagnostic result (including any intermediate or partial test pattern or diagnostic results), as well as any other intermediate or final result, created or modified using any of the disclosed methods can be transmitted, received, or accessed through a suitable communication means. Such suitable communication means include, for example, the Internet, the World Wide Web, an intranet, software applications, cable (including fiber optic cable), magnetic communication means, electromagnetic communication means (including RF, microwave, and infrared communications), electronic communication means, or other such communication means. Such communication means can be, for example, part of a shared or private network.

Moreover, any test pattern or diagnostic result (including any intermediate or partial test pattern or diagnostic result), as well as any other intermediate or final result, produced by any of the disclosed methods can be displayed to a user using a suitable display device (e.g., a computer monitor or display). Such displaying can be performed as part of a computer-implemented method of performing any of the disclosed methods.

Figure 33:
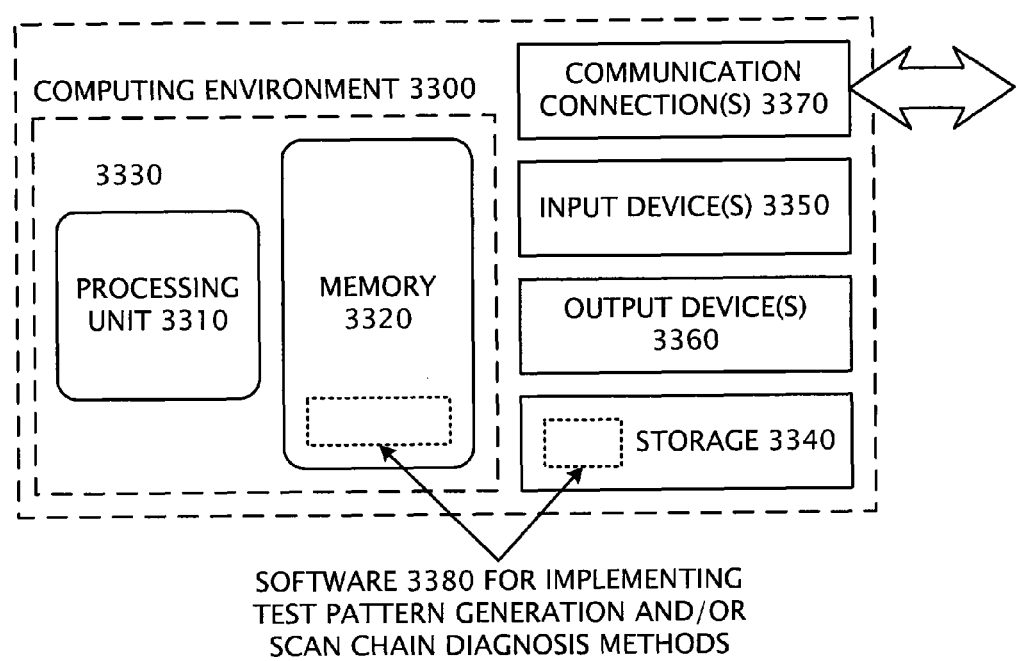
FIG. 33 is a schematic block diagram of an exemplary computing system on which embodiments of the disclosed methods can be implemented.

FIG. 33 illustrates a generalized example of a suitable computing environment 3300 in which several of the described embodiments can be implemented. The computing environment 3300 is not intended to suggest any limitation as to scope of use or functionality, as the methods described herein can be implemented in diverse general-purpose or special-purpose computing environments.

With reference to FIG. 33, the computing environment 3300 includes at least one processing unit 3310 and memory 3320. In FIG. 33, this most basic configuration 3330 is included within a dashed line. The processing unit 3310 executes computer-executable instructions and may be a real or a virtual processor. In a multi-processing system, multiple processing units execute computer-executable instructions to increase processing power. The memory 3320 can be volatile memory (e.g., registers, cache, RAM), non-volatile memory (e.g., ROM, EEPROM, flash memory, etc.), or some combination of the two. The memory 3320 stores software 3380 implementing one or more of the described test pattern generation and/or scan chain diagnosis techniques.

The computing environment may have additional features. For example, the computing environment 3300 includes storage 3340, one or more input devices 3350, one or more output devices 3360, and one or more communication connections 3370. An interconnection mechanism (not shown) such as a bus, controller, or network interconnects the components of the computing environment 3300. Typically, operating system software (not shown) provides an operating environment for other software executing in the computing environment 3300, and coordinates activities of the components of the computing environment 3300.

The storage 3340 may be removable or non-removable, and includes magnetic disks, magnetic tapes or cassettes, CD-ROMs, DVDs, or any other tangible storage medium which can be used to store information and which can be accessed within the computing environment 3300. The storage 3340 can store instructions for the software 3280 implementing any of the described test pattern generation and/or scan chain diagnosis techniques.

The input device(s) 3350 can be a touch input device such as a keyboard, mouse, pen, or trackball, a voice input device, a scanning device, or another device that provides input to the computing environment 3300. The output device(s) 3360 can be a display, printer, speaker, CD-writer, or another device that provides output from the computing environment 3300.

The communication connection(s) 3370 enable communication over a communication medium to another computing entity. The communication medium is not a storage medium but conveys information such as computer-executable instructions, test pattern data, diagnostic results, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The various test pattern generation and diagnostic methods disclosed herein can be described in the general context of computer-readable media. Computer-readable media are any available media that can be accessed within or by a computing environment. By way of example, and not limitation, with the computing environment 3300, computer-readable media include tangible computer-readable storage media such as memory 3320 and storage 3340.

Further, the one or more integrated circuits used in connection with the disclosed test pattern generation and scan chain diagnosis embodiments can additionally comprise specialized hardware components used to implement the testing (e.g., compression hardware). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits tested with embodiments of the disclosed technology or equivalents are considered to be within the scope of this disclosure.

Moreover, any of the disclosed methods can be used in a computer simulation, ATPG, or other EDA environment, wherein test patterns, test responses, and compressed test responses are determined by or otherwise analyzed using representations of circuits, which are stored on one or more computer-readable media. For presentation purposes, however, the present disclosure sometimes refers to a circuit or its components by their physical counterpart (e.g., scan cells, primary outputs, paths, circuits, and other such terms). It should be understood, however, that any reference in the disclosure or the claims to a physical component includes representations of such circuit components as are used in simulation, ATPG, or other such EDA environments.

As used in this disclosure, the "length" of a scan chain (also referred to as "L") refers to the total number of scan cells in the scan chain. Furthermore, for purposes of the following discussion, each scan cell in a scan chain is sometimes given an "index." The cell connected to a scan chain output is numbered 0 and the other cells in the scan chain are numbered sequentially in increments of one from scan output to scan input. The scan cell with index N is referred to as scan cell N. Furthermore, for a list of consecutive scan cells in a scan chain, the scan cell with the highest index is referred to as the "upper bound" (UB), and the scan cell with the lowest index is referred to as the "lower bound" (LB). The scan cells between the scan chain input and the scan input pin of a particular scan cell are called the "upstream cells" of that particular scan cell, while the scan cells between the scan chain output and the scan output pin of the particular scan cell are called the "downstream cells" of that particular scan cell. The scan cell itself does not belong to its upstream cells or downstream cells.

Embodiments of the disclosed test sets concern scan chain faults, which comprise faults that are caused by defects at a scan cell input pin, at an output pin, inside a scan cell, or on the paths used for shifting values into and out of scan cell during the scan shift process. For example, one exemplary embodiment disclosed herein generates a set of test patterns, wherein each test pattern targets a single fault in a failing scan chain. Both stuck-at and timing fault models can be targeted by embodiments of the disclosed techniques. For instance, in addition to stuck-at-0 and stuck-at-1 faults, transition fault models can be used to identify failing scan chains and fault types (e.g., slow-to-rise, slow-to-fall, slow faults, hold-time fault models, fast-to-rise, fast-to-fall, fast fault, and other such transition fault models).

II. Overview of Scan Chain Diagnosis

During scan chain failure diagnosis, scan chain test patterns (sometimes referred to as flush test patterns) can be used to identify failing scan chains and fault types. A stuck-at-0 or stuck-at-1 fault typically causes unload values on chain test patterns to be constant "0"s or constant "1"s. By contrast, a transition fault typically causes 0-to-1 transitions and/or 1-to-0 transitions to be delayed by one scan shift cycle, while a hold time fault causes 0-to-1 transitions and/or 1-to-0 transitions to be faster by one scan shift cycle. After scan chain test patterns are applied and a faulty scan chain and its fault type are identified, chain diagnosis test patterns generated according to any of the disclosed embodiments can be used to diagnose the particular scan cell in the faulty scan chain having the scan cell defect. In contrast to scan chain test patterns, which are loaded into and out of scan chains while the circuit is continuously operated in scan mode, chain diagnosis test patterns are typically launched into the system logic of the circuit-under-test (CUT) and a test response of the system logic is captured during one or more clock cycles during which the circuit-under-test is operated in its normal operational mode.

In some cases, scan chain failure diagnosis provides multiple scan cells as fault candidates. Usually these multiple candidates are consecutive scan cells in the faulty scan chain. Thus, in order to improve diagnostic resolution, scan chain failure diagnosis desirably uses test patterns that can differentiate a scan cell from its neighboring scan cells. As noted, these chain diagnosis test patterns can be applied after scan chain test patterns have been used to identify the faulty scan chain.

For a given fault model and a given set of test patterns, a scan cell N can be defined as being differentiated from scan cell M if and only if the responses of the faulty circuit with a fault on scan cell N are different from the responses of the faulty circuit with a fault on scan cell M. This criterion is used as a basis for evaluating the embodiments of the test set generation techniques described below.

III. Diagnostic ATPG for Stuck-At Faults

In this section, a conventional diagnostic test generation algorithm for scan chain failures is analyzed and its disadvantages identified by way of example. The diagnostic algorithm considered is the algorithm described in S. Kundu, "*Diagnosing Scan Chain Faults,*" *IEEE Trans. On VLSI Systems*, Vol. 2, No. 4, pp. 512-516 (December 1994). After considering the Kundu technique, embodiments of an improved diagnostic ATPG technique for a stuck-at fault in a single scan chain are described. For purposes of this discussion, it is assumed that there is an even number of inversions between a scan cell and a scan chain output. In practice, when there is an odd number of inversions between a scan cell and scan chain output, the impact of the inversions should be considered.

A. Analysis of Kundu Test Generation Algorithm

Assume that a faulty scan chain has L scan cells with indices from 0 to (L−1). Also assume that diagnostic ATPG targets a stuck-at-v fault of a faulty scan chain, where v is a binary value "0" or "1". The diagnostic test generation algorithm described in Kundu targets stuck-at faults only. Pseudocode summarizing the Kundu algorithm is shown in Table 1 below:

TABLE 1

Pseudocode for the Kundu technique

For each scan cell N in a faulty chain (from cell L−1 to cell 0)
1. Add scan cell constraints (N, N−1 ... 0) = (v, v ... v);
2. Run stuck-at ATPG to generate a test pattern for stuck-at-v fault at the data input of scan cell N;
3. If the fault is detected, save the test for cell N and continue with next cell at Step 1;
4. Otherwise, generate a test for stuck-at-v fault on data output of scan cell N:
   a. If fault detected, save the test for cell N and continue with next cell at Step 1;
   b. Otherwise, continue with next cell at Step 1

This diagnostic test generation algorithm targets each scan cell one at a time and starts with cell (L−1), which is the scan cell closest to the scan chain input. For each target scan cell N, the Kundu technique constrains scan cell N and its downstream scan cells to value v. These constraints model the impact of a stuck-at fault on scan cell N during the scan load process (that is, scan cell N and all its downstream scan cells will get value v during the scan load process due to the stuck-at-v fault on cell N). With these constraints, the Kundu algorithm first tries to create a test pattern to capture a logic value opposite to the stuck-at fault value into the target scan cell N. If successful, the algorithm moves on to the next scan cell; otherwise, it tries to create a test pattern to detect the stuck-at-v fault at the data output of the target scan cell. Once a test pattern is created for a target scan cell, it is applied on a tester. If the expected value for a target scan cell is observed, then it is ascertained that the fault is in the upstream cells of the target scan cell.

Although the above algorithm is straightforward for scan chain diagnosis, there are drawbacks to the algorithm: when the scan cells in a faulty chain have a logic dependency or a correlation to their neighbor cells through the system logic, the patterns generated by the Kundu algorithm may not distinguish a target cell and its neighbor cells. For example, assume there is a stuck-at-0 fault in a scan chain with seven scan cells, cell 0 to cell 6. An example scan chain 110 with this configuration is shown in block diagram 100 of FIG. 1. The Kundu algorithm first targets scan cell 6. The Kundu algorithm tries to capture a value "1" into this scan cell while constraining the scan load values of all other cells to "0". Assuming that a pattern can be successfully generated, if the value "1" is observed at cell 6 on a tester, it can be determined that the fault must be upstream of scan cell 6. However, if value "1" is not observed on scan cell 6, the diagnosis algorithm will move on to target the next cell. While targeting scan cell 5 (which is illustrated in FIG. 1), scan load values of scan cells 5, 4, 3, 2, 1 and 0 are constrained to "0". The above algorithm tries to capture a "1" into scan cell 5. If a test pattern is successfully generated and if the expected capture value "1" is not observed on scan cell 5, the algorithm moves on to target scan cell 4.

Note that from FIG. 1, there are two paths through system logic 120 to set the data input pin of scan cell 5 to a value of "1": path A and path B. Path B is driven by scan cell 6. While targeting scan cell 5, if path B is selected to set its data input to value 1 in the above algorithm, the generated test pattern will fail to isolate the defect to scan cell 6. This is because a stuck-at-0 fault in scan cell 6 may cause scan cell 5 to capture value "0", which leads to the observed value "0" on scan cell 5. (Note that the particular system logic shown on path B in FIG. 1 merely shows a representation of system logic and does not depict with specificity all possible combinations of logic that produce an observed value "0" at scan cell 5 when scan cell 6 is defective. It is to be understood that countless combinations of logic—all known to those of ordinary skill in the art—are possible and can produce such a result.) This means, if path B is selected to set value "1" into scan cell 5, the generated test pattern cannot distinguish which scan cell is defective, scan cell 6 or scan cell 5. In order to know whether the defect is in scan cell 6, path A is desirably selected to set the data input of scan cell 5 to "1". By selecting path A to set value 1 to scan cell 5, if a value 1 is observed at scan cell 5, then it can be determined that the defect is upstream of scan cell 5.

This example shows that the Kundu algorithm cannot guarantee that the generated test pattern will differentiate scan cells that have a logical dependency through combinational logic. In practice, it is very common for a scan chain to contain scan cells from the same functional block where scan cells have a logic dependency through combinational logic.

Another issue with the Kundu algorithm is that fault effect masking may occur during the failure observation process. For example, if there is more than one faulty scan chain in a circuit, the fault effects propagated to other faulty scan chains could be masked by defects in other faulty scan chains.

B. Differentiating Scan Cells Through Data Capture

Using embodiments of the disclosed technology, a scan cell can be differentiated from its downstream scan cells by capturing data from system logic ("data capture"). The conditions used to differentiate a scan cell N from its immediate downstream neighbor cell (N−1) are analyzed in the discussion below. Then, a proof is provided showing that a test pattern generated by an embodiment of the disclosed technology distinguishing cells N and (N−1) also distinguishes N from all its downstream scan cells.

Figure 2A:
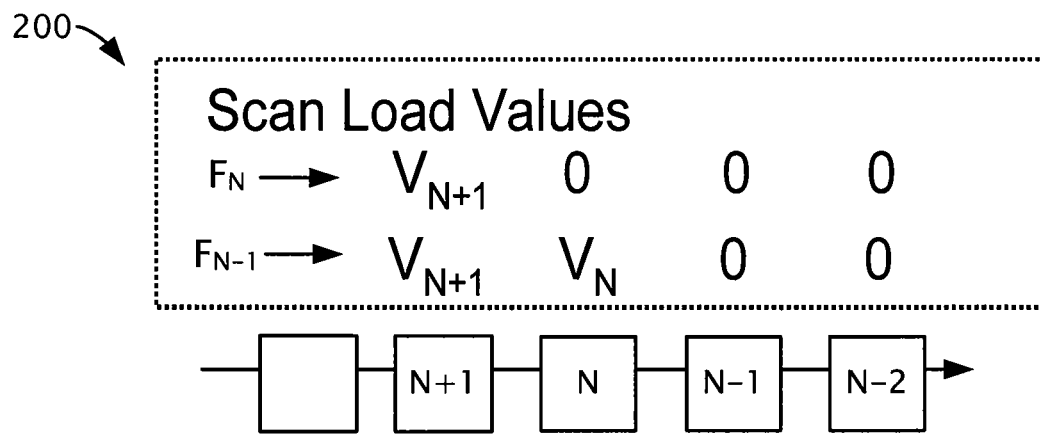
FIGS. 2(a) and 2(b) are schematic block diagrams illustrating how a stuck-at-0 fault on adjacent scan cells can be differentiated using embodiments of the disclosed technology.
Figure 2B:
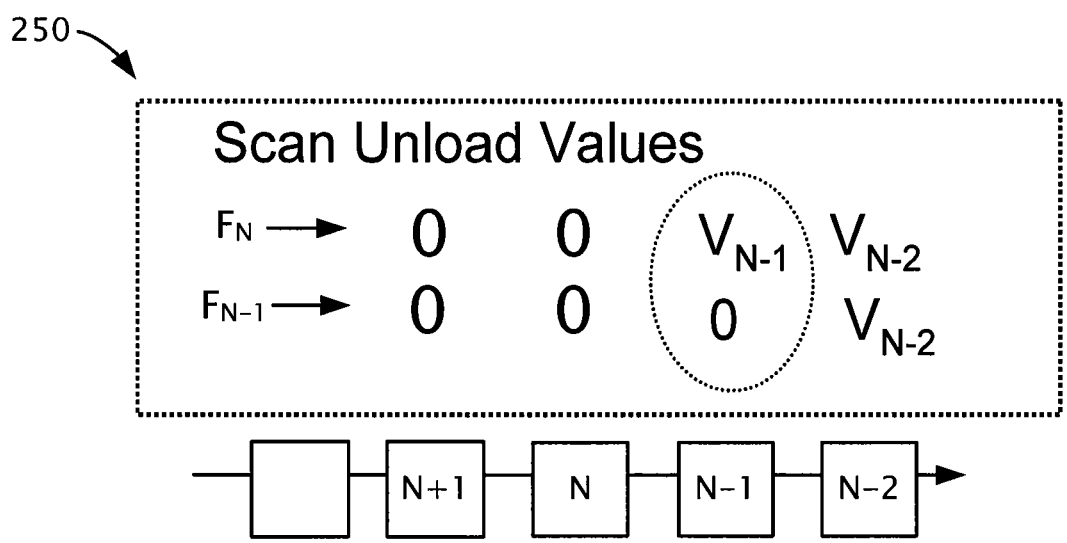

FIGS. 2(*a*) and 2(*b*) are schematic block diagrams 200 and 250 that illustrate how scan cells with stuck-at-0 faults can be differentiated through data captured from the system logic according to embodiments of the disclosed technology. To differentiate scan cells N and (N−1) through data capture, the scan unload values on scan cells N and (N−1) should be different for a circuit with a fault on cell N (designated as $F_N$ in FIGS. 2(*a*) and 2(*b*)) and a circuit with a fault on scan cell N−1 (designated as $F_{N-1}$ in FIGS. 2(*a*) and 2(*b*)). To illustrate how to distinguish $F_N$ and $F_{N-1}$, consider a stuck-at-0 fault. FIG. 2(*a*) shows the scan load values on the faulty circuits $F_N$ and $F_{N-1}$ according to one exemplary embodiment of the disclosed technology. For both circuits, the scan load values of scan cells N−1, N−2, are "0"s. FIG. 2(*b*) shows the unload values on faulty circuits $F_N$ and $F_{N-1}$ according to one exemplary embodiment of the disclosed technology. During the scan unload process, value $V_{N-1}$ can be safely shifted out in faulty circuit $F_N$, while in faulty circuit $F_{N-1}$ only "0"s can be shifted out of scan cell N and scan cell (N−1). In order to distinguish faulty circuits $F_N$ and $F_{N-1}$, a value "1" is desirably captured into scan cell (N−1) in a manner that ensures that the captured value of scan cell (N−1) is not sensitive to the stuck-at-0 fault in scan cell N. For example, scan cell (N−1) should capture a value "1" regardless of whether there is a stuck-at-0 fault on scan cell N. Otherwise, it cannot be determined whether scan cell N or scan cell (N−1) caused the wrong observed value at scan cell (N−1). By recognizing that most real circuits have some logic dependency between neighboring cells of the same scan chain and by accounting for that dependency, improvements over the Kundu algorithm can be achieved.

In one exemplary embodiment of the disclosed technology, the following chain diagnosis test pattern generation procedure can be used to differentiate faulty circuits $F_N$ and $F_{N-1}$ for a stuck-at-0 fault: (1) constrain scan load values of scan cells N, N−1, N−2, . . . , 0 to value "0"; and (2) force a value of "1" on the data input of scan cell (N−1) (in other words, target the stuck-at-0 fault at the data input of cell (N−1)).

For a stuck-at-1 fault, the following procedure can be used: (1) constrain scan load values of scan cells N, N−1, N−2, . . . , 0 to value "1"; and (2) force a value of "0" on the data input of scan cell (N−1) (in other words, target the stuck-at-1 fault at the data input of cell (N−1)).

By adding an extra constraint at cell N during the chain diagnosis test pattern generation process, the generated test pattern provides fault "differentiation" between cells N and N−1, even if there is a logic dependency between these two cells. In particular, and according to the embodiment introduced above, the scan load value of scan cell N is constrained to a value of "0" for stuck-at-0 faults. This constraint causes a stuck-at-0 fault on scan cell N to not be activated. Accordingly, the scan cell N has no impact on the captured value at scan cell (N−1). Note that the above constraints provide sufficient (but not necessary) conditions to differentiate faulty scan cells N and (N−1). As noted, for stuck-at-1 faults, the opposite constraints are used (the scan cell load value of scan cell N is constrained to a value of "1").

There could be other ways to differentiate cell N from (N−1). For example, one could load a value of "1" into scan cell N but constrain its propagation path so that it does not impact the scan cell (N−1) capture value. In this case, structural and logical analysis could be used to prevent scan cell N data from propagating to scan cell (N−1) through combinational logic.

Figure 3:
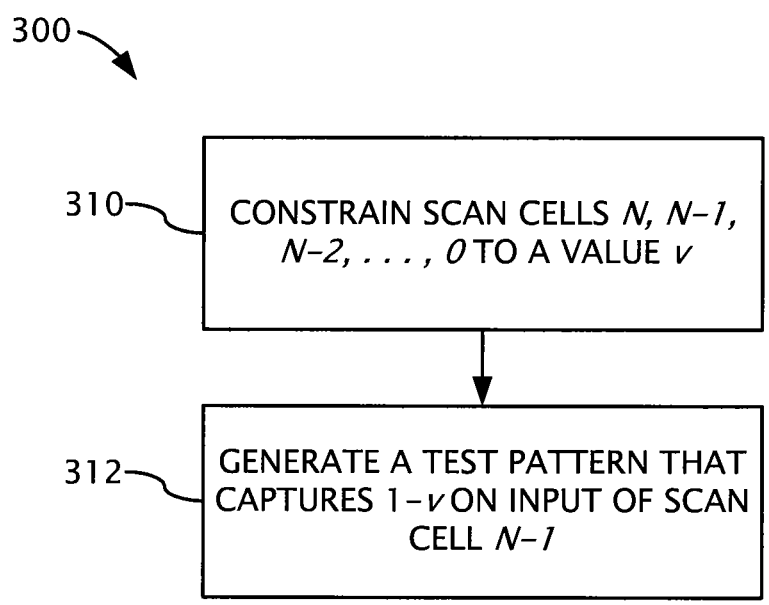
FIG. 3 is a flow chart of a first method for generating a chain diagnosis test pattern according to the disclosed technology.

FIG. 3 is a flowchart of an exemplary method 300 for generating a test pattern according to the disclosed technology where the scan chains operate with no inversions between the scan cells. In particular, the method 300 is a test generation technique for detecting a stuck-at-v fault (where v is typically a "0" or "1") for a scan cell N in a scan chain. The method acts shown in FIG. 3 can be performed alone or in various combinations or subcombinations with one another. Furthermore, the method acts of the method 300 can be performed in a different order and/or include various other additional acts.

The test generation technique illustrated in flowchart 300 is typically performed as part of automatic test pattern generation performed by an ATPG software tool. Moreover, the technique is typically performed using a representation of the circuit-under-test that describes the various components and connections of the circuit-under-test (e.g., a gate-level netlist, GDSII file, Oasis file, or other suitable circuit description).

At 310, for a targeted scan cell N, scan load values of scan cells N, N−1, N−2, N−3, . . . , 0 are constrained to a non-fault-activating value v. In some embodiments, only a portion of scan cells N, N−1, N−2, N−3, . . . 0 (such as at least N and N−1) are constrained to a value v.

At 312, a test pattern is generated that captures a fault activating value 1−v on the data input of scan cell N−1. Thus, even though N is the scan cell targeted for diagnosis, cell N−1 is targeted for loading the value 1−v, which will reveal the existence of a stuck-at-v fault at cell N.

Pseudocode for an embodiment of the exemplary technique is shown in Table 2 below:

TABLE 2

Exemplary pseudocode for a targeting a scan cell N

Test_Gen_for_Target_Cell (N, stuck-at-v):
• Constrain scan load values of scan cells N, N−1, N−2, N−3, . . . ,
  0 to non-fault-activating value v;
• Generate a test pattern to capture fault-activating value 1−v on data
  input of scan cell N−1.

Note that in the above procedure, method act 310 adds a constraint to scan cell N during the test pattern generation process such that a stuck-at-v fault in scan cell N does not impact the capture value of scan cell N−1. The method act also adds constraints to scan cells N−1, N−2, . . . , 0. These constraints help make sure that the desired capture value 1−v of scan cell N−1 is valid when there is a defect at scan cell N−1. Method act 312 generates a test pattern such that scan cell N−1 captures an opposite value of the scan chain stuck-at value.

Figure 10:
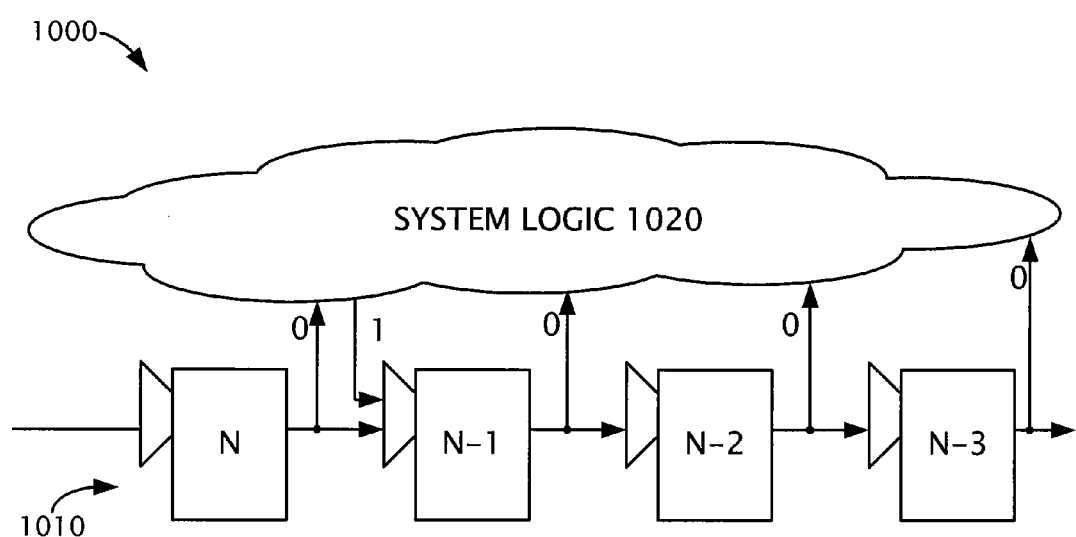
FIGS. 10 and 11 are schematic block diagrams illustrating the application of the method illustrated in FIG. 3.
Figure 11:
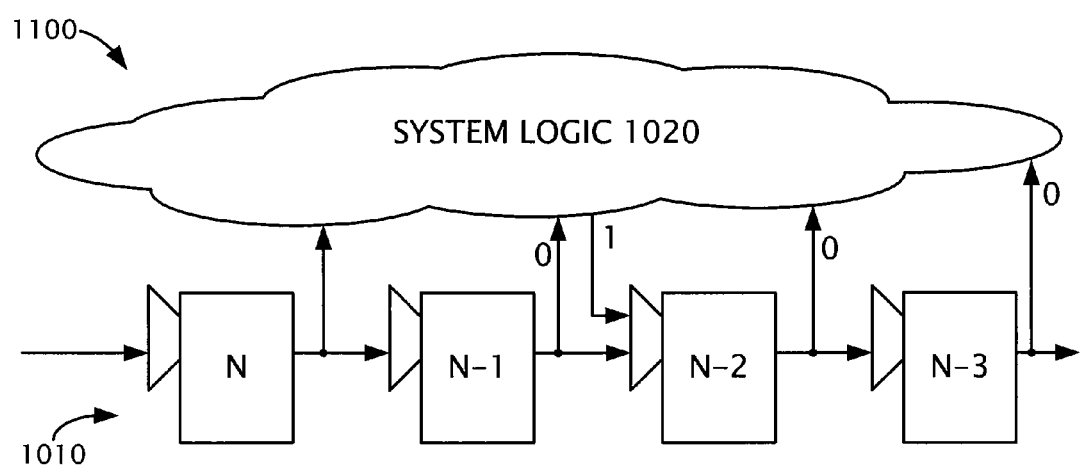

FIGS. 10 and 11 are schematic block diagrams 1000 and 1100 illustrating application of the method 300 to two adjacent scan cells N and N−1 in a faulty scan chain 1010. In the following example, the test pattern generation method is performed to detect a stuck-at-0 fault in the faulty scan chain. Referring first to FIG. 10, the test pattern generation method 300 constrains the scan-in values on scan cells N, N−1, N−2, . . . , 0 to "0" such that the chain diagnosis pattern causes "0"s to be output from the scan cells into system logic 1020 once the test pattern is loaded into the faulty scan chain and the capture phase begins. Further, the test pattern generated by the method 300 causes a "1" to be loaded into the scan cell N−1 during the capture phase of testing with the test pattern (e.g., using values loaded into other scan cells of the circuit-under-test). To perform diagnosis, the value captured into scan cell N−1 can be examined. If the value "1" is observed at cell N−1, then it can be determined that the defect is on cell N (assuming a test pattern targeting N+1 was applied previously and produced a test response indicating that the defect was downstream of N+1). If the value "0" is observed at cell N−1, then it can be determined the defect is not on cell N but is on a cell downstream of N and testing can be continued.

FIG. 11 illustrates application of a second chain diagnosis pattern produced using the method 300 for the next scan cell in the faulty scan chain 1010. For the next scan cell, the test pattern generation method 300 constrains the scan-in values on scan cells N−1, N−2, . . . , 0 to "0" such that the chain diagnosis pattern causes "0"s to be output from the scan cells into the system logic 1020 once the test pattern is loaded into the scan chain and the capture phase begins. Further, the test pattern generated by the method 300 causes a "1" to be loaded into the scan cell N−2 during the capture phase of testing with the test pattern. To perform diagnosis, the value loaded into scan cell N−2 can be examined. If the value "1" is observed at cell N−2, then it can be determined that the defect is on cell N−1 (since scan cell N was ruled out by the first pattern). If the value "0" is observed at cell N−2, then it can be determined that the defect is not on cell N−1 but is on a cell downstream of N−1 and testing can be continued. Diagnostic results based at least in part on these determinations can then be produced and stored (e.g., on one or more computer-readable media). Together, the test pattern illustrated in FIG. 10 and the test pattern illustrated in FIG. 11 are sufficient to identify and differentiate a defect on cell N−1.

In general, the method 300 generates test patterns to distinguish scan cells N and N−1 by considering the logic dependency of these scan cells. In practice, there may be a logic dependency between a scan cell N and any of its upstream or downstream scan cells. In order to illustrate that the generated test patterns can distinguish a scan cell N from any other downstream scan cell, the following theorem and proof are provided:

Theorem 1: For a scan chain with a stuck-at-v fault, a pattern generated by procedure Test_Gen_for_Target_Cell (N, stuck-at-v) described above can differentiate scan cell N from all its downstream scan cells N−1, N−2, N−3, . . . , 0.

Proof: In order to prove that a test pattern generated using the exemplary procedure can differentiate scan cell N from cells N−1, N−2, . . . , 0, it should be proven that for the given test pattern, the faulty circuit responses with a fault on scan cell N are different from the responses of the faulty circuits with faults on scan cells N−1, N−2, . . . , 0.

If the defect is at scan cell N, scan cell N−1 will capture value 1−v and this capture value 1−v at scan cell N−1 should be shifted to the scan chain output and be observed during the scan unload process so that the absence of a failure on scan cell N−1 can be observed.

If the defect is at scan cell N−1 or any other downstream scan cells of N, the expected capture value 1−v at scan cell N−1 will be corrupted by the defect during the scan capture or scan unload process. Thus, a failure at scan cell N−1 will be observed during scan unload. This way, cell N can be distinguished from all its downstream scan cells N−1, N−2, . . . , 0, thus completing the proof.

Figure 15:
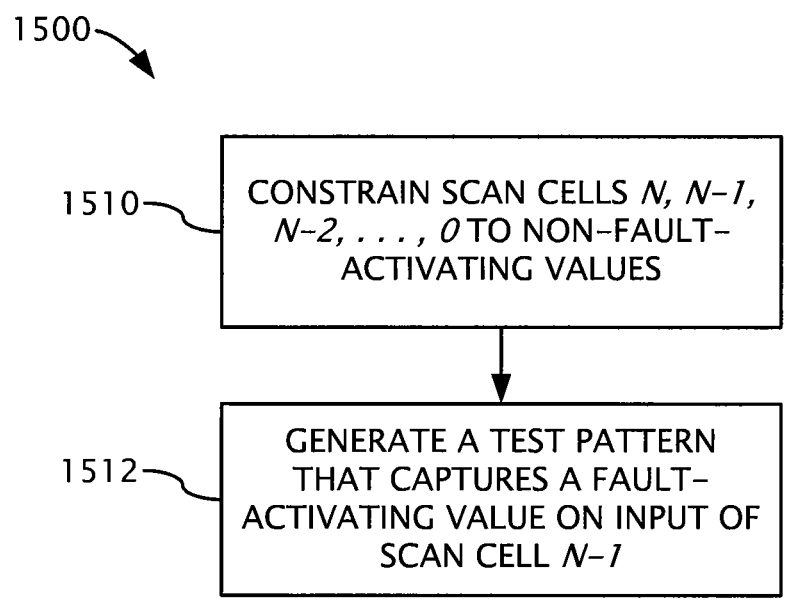
FIG. 15 is a flow chart of a more generalized test pattern generation method than the method shown in FIG. 3.

The exemplary methods introduced above assume that there are no inversions or only an even numbers of inversions between scan cells of the faulty scan chain. For situations where odd numbers of inversions are present in the scan chain, the methods can be modified to account for the inversions. FIG. 15 is a flowchart of an exemplary method 1500 that represents a more generalized test pattern generation method than the method 300 and that is suitable for situations where inversions are desirably accounted for. For illustrative purposes, the method 1500 is described in the context of detecting a stuck-at-v fault for a scan cell N in a scan chain. It should be understood that wherever method 300 is discussed in this disclosure, it can be substituted by method 1500.

At 1510, for a targeted scan cell N, scan load values of scan cells N, N−1, N−2, N−3, . . . , 0 are constrained to values that are selected to not activate the targeted fault as they are loaded through scan cell N. In some embodiments, only a portion of scan cells N, N−1, N−2, N−3, . . . 0 (such as at least N and N−1) are constrained to such non-fault-activating values.

At 1512, a test pattern is generated that captures a value selected to activate the targeted fault on the data input of scan cell N−1. Thus, even though N is the scan cell targeted for diagnosis, cell N−1 is targeted for capturing the fault-activating value, which will reveal the existence of a stuck-at-v fault at cell N. The resulting test pattern can then be stored (e.g., on one or more computer-readable media).

IV. Generating a Complete Test Set

Figure 4:
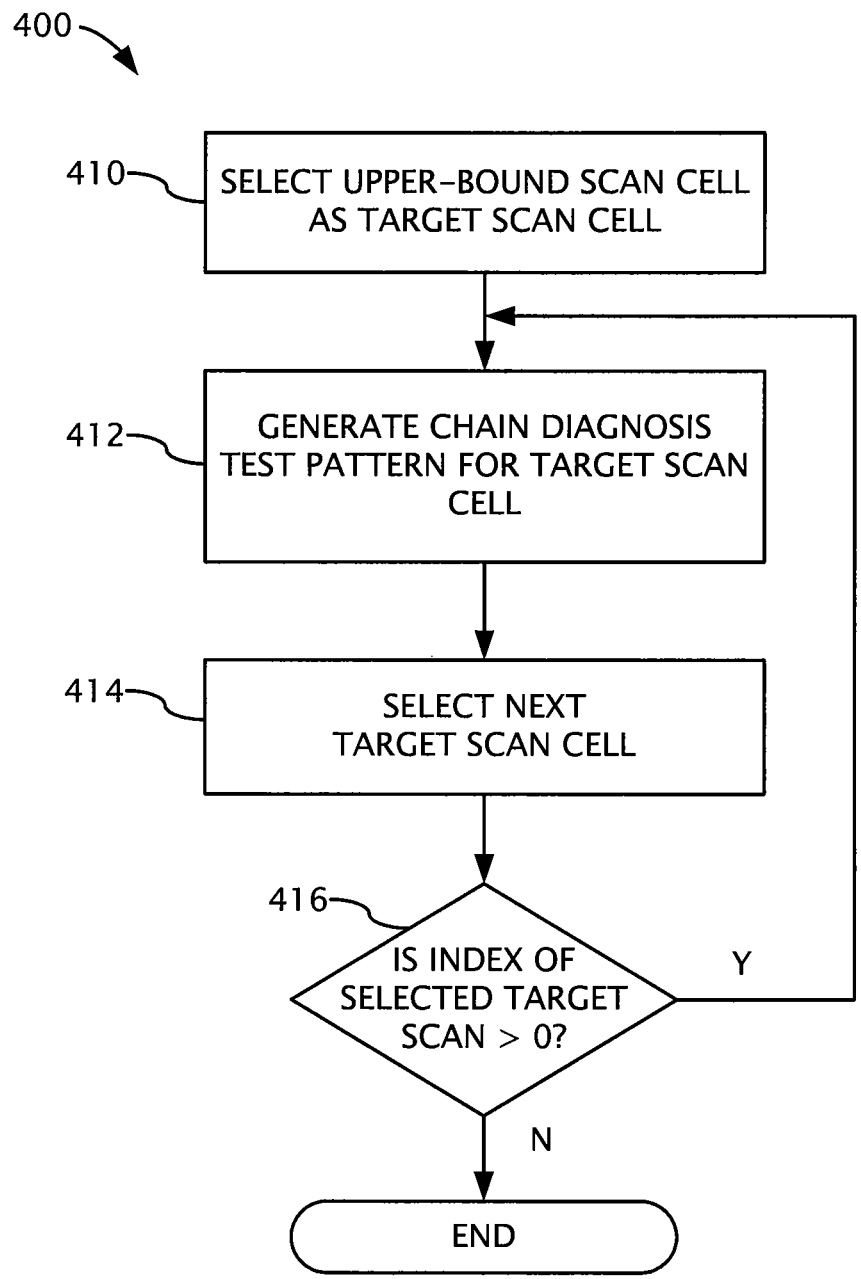
FIG. 4 is a flow chart of a first method for generating a complete set of chain diagnosis test patterns according to the disclosed technology.

Using the exemplary method 300, a test pattern generation technique can be developed that generates a complete test set. FIG. 4 is a flowchart of an exemplary method 400 for generating diagnostic test patterns for a given set of scan cells in a faulty scan chain with a stuck-at-v fault. The method acts shown in FIG. 4 can be performed alone or in various combinations and subcombinations with one another. Furthermore, the method acts of the method 400 can be performed in a different order and/or include various other additional acts.

At 410, the upper-bound scan cell is selected as the target scan cell N.

At 412, a chain diagnosis test pattern generation method is performed for the targeted scan cell. For example, the method 300 can be performed for the targeted scan cell.

At 414, the next targeted scan cell is selected. In this embodiment, the next targeted scan cell is the next scan cell downstream from the previously targeted scan cell (the scan cell N−1).

At 416, a determination is made as to whether the next targeted scan cell has an index value higher than the lower-bound scan cell. If so, the method 400 returns to method act 412 for test pattern generation for the next targeted scan cell; otherwise, the method 400 terminates.

Pseudocode for an embodiment of the exemplary method 400 is shown in Table 3 below:

TABLE 3

Exemplary pseudocode for generating a test set

Diagnostic_Test_Gen (LB, UB, stuck-at-v)
    For each cell N between UB and LB in faulty chain
      • Set N=UB
      • Call procedure Test_Gen_for_Target_Cell (N, stuck-at-v)
      and set N = N−1
      • If (N > LB), repeat previous method act
      • All scan cells have been processed, stop The exemplary method 400 targets scan cells one-by-one starting with the upper bound scan cell and moving toward the lower bound scan cell. In other embodiments, however, the scan cells are targeted in a different order, such as from the lower bound scan cell to the upper bound scan cell or according to a random or partially random selection methodology. In the exemplary embodiment, if a whole scan chain is targeted, the upper bound and lower bound will be the last and the first scan cell of the scan chain. For each target scan cell, the exemplary procedure 400 iteratively calls the chain diagnosis test pattern generation method 300 (e.g., procedure Test_Gen_for_Target_Cell(N, stuck-at-v)) to create a test pattern. Because a test pattern generated by the exemplary procedure for scan cell N differentiates a scan cell N from its downstream cells, if test patterns are generated for all scan cells upstream of the lower-bound scan cell by this procedure, each of scan cells will have different faulty behavior for at least one test pattern in the test pattern set. In certain embodiments, then, the resulting test set is a "complete" test set comprising test patterns that are guaranteed to differentiate each scan cell from all other candidate scan cells in the scan chain.

V. Additional Considerations

It is possible that embodiments of the technique introduced above will not be able to generate a test pattern for a targeted scan cell. For instance, there are several reasons that the techniques may fail to create a test pattern. One reason is that it may not be possible for a test pattern to meet all the desired constraints. Another reason may be that the test generation program may have reached a time limit (e.g., a CPU time limit), a back-tracking limit, or a memory usage limit (any of which may be preset or set by a user) before a test pattern is generated. In the following sections, test pattern generation techniques are introduced that can be used when a test pattern cannot be generated for a targeted scan cell using embodiments of the exemplary test set generation procedures introduced above.

A. Extending Test Generation Using Data Capture

In some exemplary embodiments of the disclosed technology, when it is not possible to differentiate scan cell N from all its downstream scan cells, the constraints can be relaxed such that a test pattern is generated to differentiate cell N from cells N−x, N−x−1, . . . , 0, where x is a positive integer and x>1.

Figure 5:
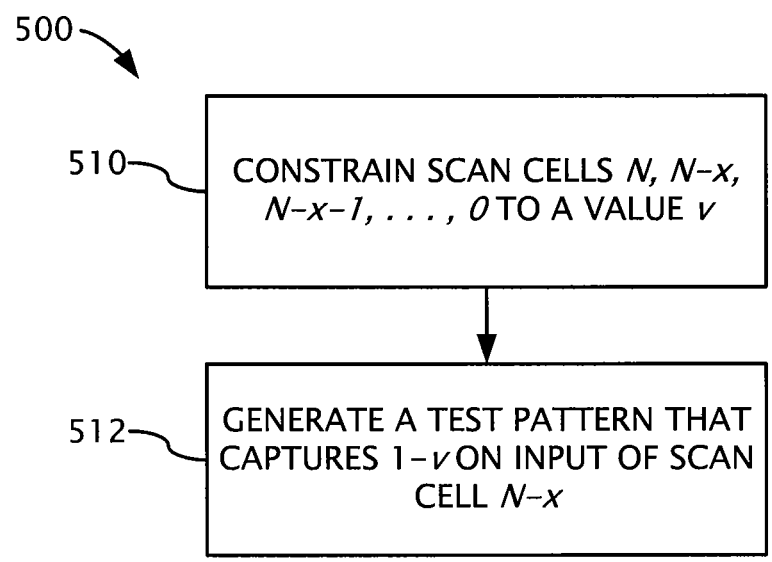
FIG. 5 is a flow chart of a second method for generating a chain diagnosis test pattern according to the disclosed technology that can be used when the method of FIG. 3 is not able to generate a test pattern.

FIG. 5 is a flowchart of an exemplary method 500 for generating diagnostic test patterns that differentiate a scan cell N from a scan cell N−x for a given set of scan cells in a faulty scan chain with a stuck-at-v fault. The method acts shown in FIG. 5 can be performed alone or in various combinations and subcombinations with one another. Furthermore, the method acts of the method 500 can be performed in a different order and/or include various other additional acts.

At 510, the load values of scan cell N, and scan cells N−x, N−x−1, . . . , 0 are constrained to a non-fault-activating value v. In some embodiments, only some of scan cells N, N−x, N−x−1, . . . , 0 (such as N and N−x) are constrained to a value v.

At 512, a test pattern to capture fault-activating value 1−v on data input of scan cell N−x is generated.

Pseudocode for an embodiment of the exemplary method 500 is shown in Table 4 below:

TABLE 4

Exemplary pseudocode for targeting a scan cell N and differentiating from scan cell N−x Extended_Test_Gen_for_Target_Cell(N, N−x, stuck-at-v)
    • Constrain load values of scan cell N, and scan cells N−x,
    N−x−1, . . . , 0 to non-fault-activating value v;
    • Generate a test pattern to capture fault activating value 1−v on
    data input of scan cell N−x.

Note that in the method 500, the method act 510 adds a constraint to scan cell N such that scan cell N stuck-at-v fault does not impact the capture value of scan cell N–x. It also adds constraints to scan cells N–x, N–x–1, . . . , 0. These constraints can help ensure that the desired capture value 1–v is valid when there is a defect on scan cell N–x. The method act 512 generates a test pattern such that scan cell N–x captures an opposite value of the scan chain stuck-at value.

Using an approach similar to the one described in connection with Theorem 1 above, one can prove that a test pattern generated by the method 500 can differentiate scan cell N from scan cells N–x, N–x–1, . . . , 0.

Figure 16:
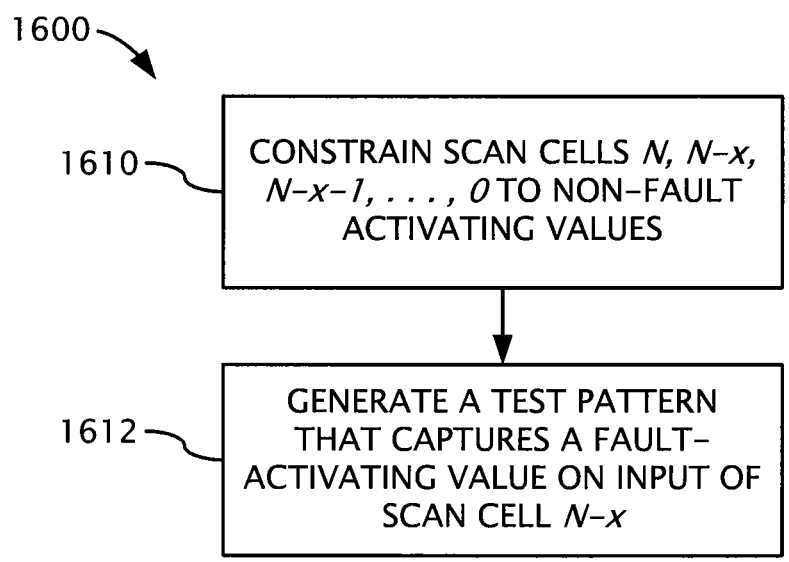
FIG. 16 is a flow chart of a more generalized test pattern generation method than the method shown in FIG. 5.

The exemplary methods introduced above assume that there are no inversions or only even numbers of inversions between scan cells of the faulty scan chain. For situations where odd numbers of inversions are present in the scan chain, the methods can be modified to account for the inversions. FIG. 16 is a flowchart of an exemplary method 1600 that represents a more generalized test pattern generation method than the method 500 and that is suitable for situations where inversions are desirably accounted for. For illustrative purposes, the method 1600 is described in the context of detecting a stuck-at-v fault for a scan cell N in a scan chain. It should be understood that wherever method 500 is discussed in this disclosure, it can be substituted by method 1600.

At 1610, the load values of scan cell N, and scan cells N–x, N–x–1, . . . , 0 are constrained to values selected to not activate the targeted fault as they are loaded through scan cell N. In some embodiments, only some of scan cells N, N–x, N–x–1, . . . , 0 (such as N and N–x) are constrained to such non-fault-activating values.

At 1612, a test pattern to capture a value selected to activate the fault on the data input of scan cell N–x is generated. The resulting test pattern can then be stored (e.g., on one or more computer-readable media).

B. Differentiating Scan Cells Through Fault Propagation

When it is not possible to differentiate scan cell N from all its downstream scan cells, the exemplary method 500 can be used in exemplary embodiments of the disclosed technology to help differentiate cell N from cell N–x, N–x–1, N–x–2, . . . , 0 where x>1. When the procedure is used, and in order to make a complete diagnostic test set, test patterns to differentiate cell N from N–1, N–2, . . . , N–x+1 may still need to be generated. Exemplary techniques for generating such test patterns are introduced in this section.

For example, if it is not possible to differentiate scan cell N from N–1, N–2, . . . , N–x+1 by using data capture through combinational logic, another way to differentiate a scan cell from its downstream cells is to propagate the effect of faulty load values to reliable observation points. For instance, primary outputs, scan cells in good chains, and scan cells downstream of a target scan cell in the faulty chain can be used as reliable observation points. Fault effects captured into these scan cells are not corrupted by scan chain faults during the scan unload process. Note that scan cells upstream of the target scan cell in the faulty scan chain are unreliable observation points because scan capture values in these scan cells will be shifted through the target scan cell during scan unload process. Thus, fault effects captured into these scan cells can be corrupted by the stuck-at fault in the target scan cell.

Figure 6:
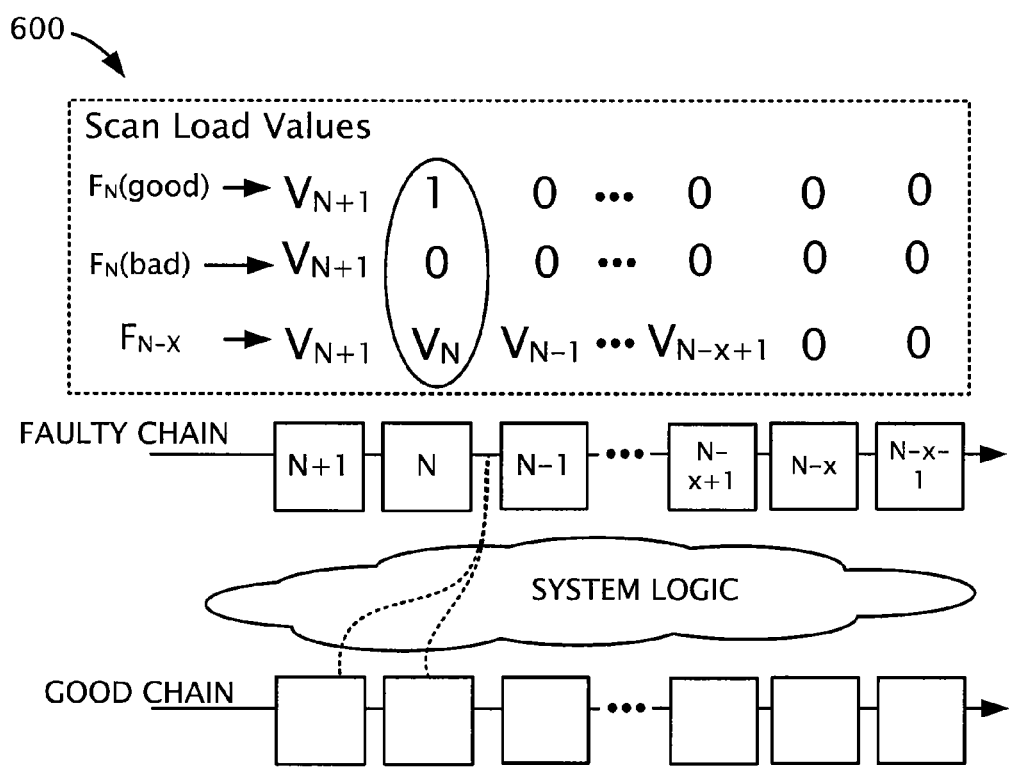
FIG. 6 is a schematic block diagram illustrating how scan cells with stuck-at-0 faults can be differentiated by propagating a fault effect.

FIG. 6 is a schematic block diagram 600 illustrating an exemplary embodiment of a fault effect propagation technique that can be used to help differentiate two scan cells N and N–x. Note that after the scan load process, in both faulty circuits $F_N$ and $F_{N-x}$, scan data output of cell N–x has a value "0". This makes it difficult to generate a pattern to differentiate scan cell N and N–x through fault propagation for data output fault on scan cell N–x. In certain embodiments of the disclosed technology, instead of using a fault on scan cell N–x, faulty circuits $F_N$ and $F_{N-x}$ are differentiated by propagating a fault effect at the data output of scan cell N. The reason for this is based on the fact that for scan cell N, different values might be loaded for faulty circuits $F_N$ and $F_{N-x}$.

In particular, FIG. 6 illustrates scan load values for a good chain $F_N(F_N(good))$ (in this example, the test pattern values that are intended to be loaded into the scan chain in the absence of any fault at scan cell N) and for a faulty chain $F_N(F_N(bad))$ (in this example, the test pattern values as they appear at the output of each scan cell after being loaded into a scan chain with a stuck-at-0 fault on scan cell N). FIG. 6 also shows that if the value "0" output from the scan cell N (or a value attributable to the "0" output from the scan cell N) can be propagated to a scan cell of a good scan chain, the stuck-at-0 fault can be detected.

Figure 7:
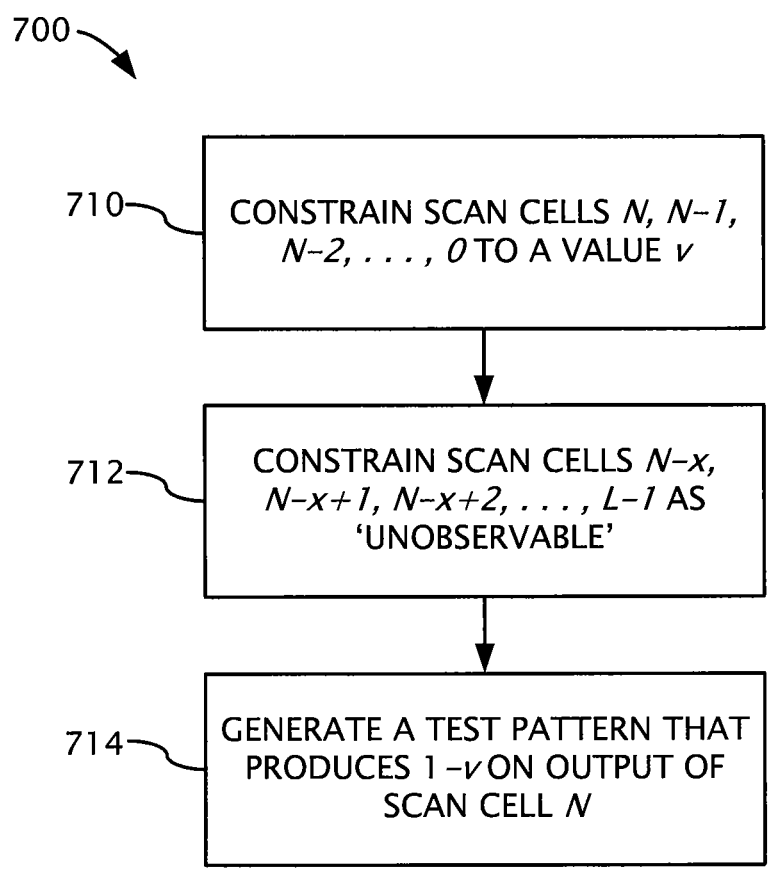
FIG. 7 is a flow chart of a third method for generating a chain diagnosis test pattern by propagating a fault effect as in FIG. 6 that can be used in conjunction with the method of FIG. 5.

FIG. 7 is a flowchart of an exemplary method 700 for generating a chain diagnosis test pattern that differentiates faulty circuit responses for $F_N$ and $F_{N-x}$ and that detects stuck-at-v faults. The method acts shown in FIG. 7 can be performed alone or in various combinations or subcombinations with one another. Furthermore, the method acts of the method 700 can be performed in a different order and/or include various other additional acts.

At 710, the load values for scan cells N–1, N–2, . . . , 0 are constrained to a non-fault-activating value v.

At 712, upstream scan cells N–x, N–x+1, N–x+2, . . . , L–1 are constrained (or otherwise classified) as "unobservable."

At 714, a test pattern having these constraints is generated to detect a stuck-at-v fault at the data output of cell N. That is, a test pattern is generated (e.g., using an ATPG tool) that produces the value 1–v at the output of cell N and propagates that value to an observable scan cell (e.g., in a different scan chain or in one of scan cells N–x, N–x–1, . . . , 0).

With the additional constraints that the upstream scan cells N–x, N–x+1, N–x+2, . . . , L–1 be unobservable, the resulting test pattern will differentiate the pair of scan cells N and N–x, thus resulting in improved diagnostic resolution. In particular embodiments of the disclosed technology, the first two method acts 710, 712 can be handled by forcing constant values to specific scan cells or by disabling fault observation at specific scan cells. Further, a regular stuck-at ATPG program can be used for the third method act 714. Setting cell N–x as unobservable (as performed by the method act 712) can help differentiate scan cells N and N–x. For example, one major reason that scan cell N and N–x cannot be differentiated through fault effect propagation is that scan cell N–x is used as the only observation point of scan cell N failure. These three acts (which can all be characterized as constraints on the test pattern generation process) provide sufficient conditions (but not necessary conditions) to guarantee that the generated test pattern differentiates scan cell N and N–x.

Pseudocode for an embodiment of the exemplary method 700 is shown in Table 5 below:

TABLE 5

Exemplary pseudocode for a fault effect propagation technique

Figure 12:
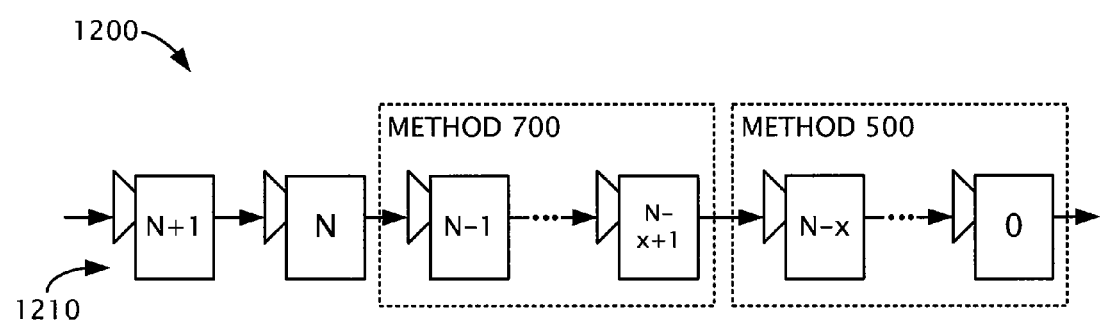
FIGS. 12, 13 and 14 are schematic block diagrams illustrating the application of the methods illustrated in FIGS. 5 and 7.
Figure 13:
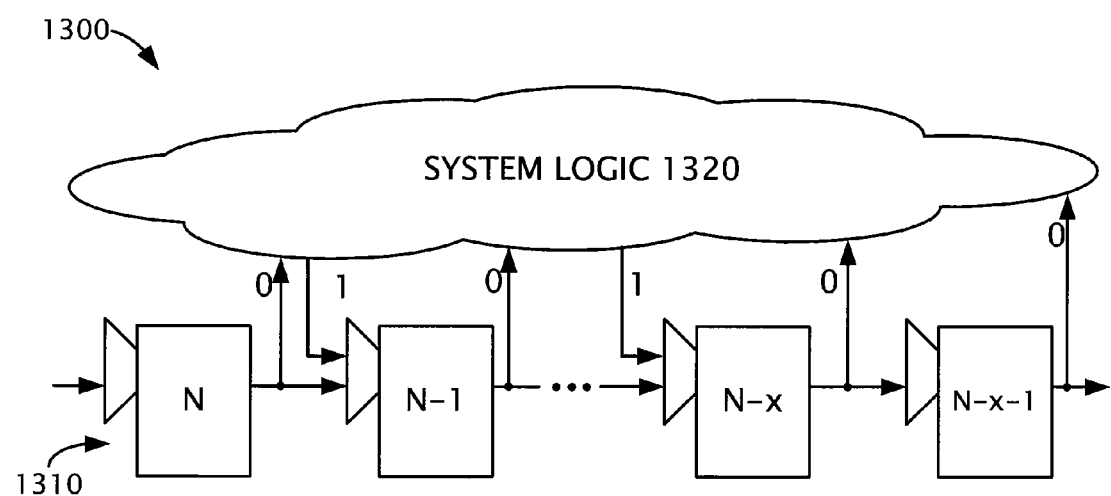
Figure 14:
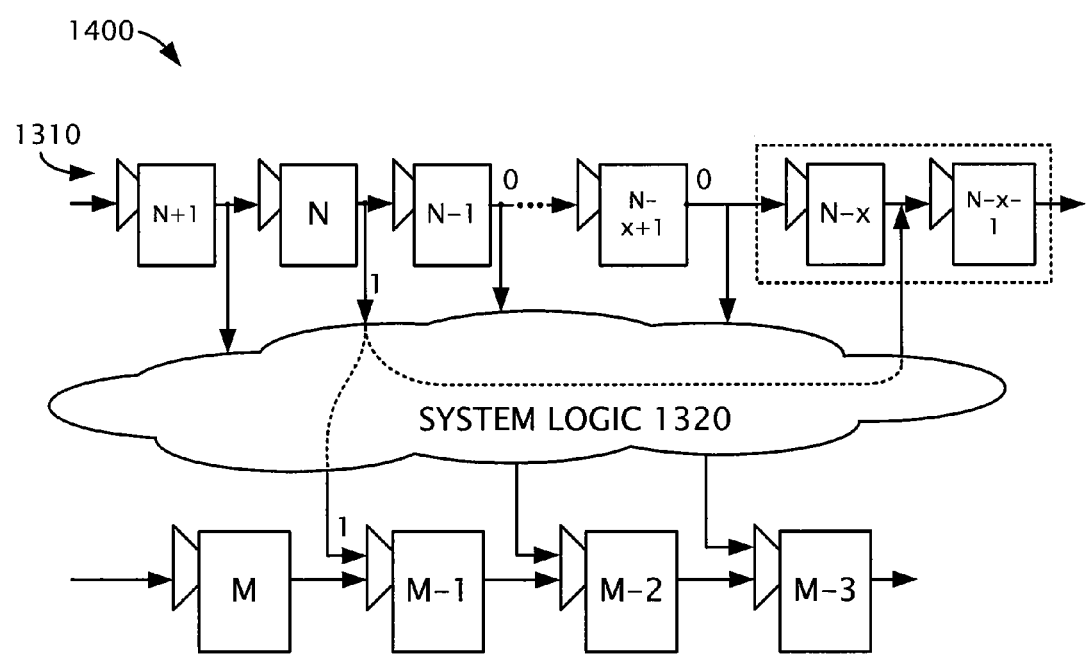

Cell_Pair_Differentiation(N, N–x, stuck-at-v)
 • Constrain scan load values of scan cells N–1, N–2, . . . ,
  0 to binary value non-fault activating v
 • Constrain upstream scan cells N–x, N–x+1, N–x+2, . . . ,
  L–1 as unobservable
 • Generate a test to detect stuck-at-v fault at data output
  of scan cell N FIGS. 12 through 14 illustrate the application of the methods 500 and 700 to a group of scan cells in a faulty scan chain. FIG. 12 is a schematic block diagram 1200 showing a faulty scan chain 1210 and illustrating how the methods 500 and 700 can be collectively used to differentiate scan cell N from scan cell N−1 and its downstream scan cells. In FIG. 12, for example, method 500 is used to differentiate scan cells downstream from scan cell N−x, where scan cell N−x is a scan cell downstream of scan cell N, but not the next adjacent scan cell downstream from scan cell N. Further, FIG. 12 illustrates that method 700 is used to differentiate the scan cells N−1 to scan cell N−x+1. Thus, the combination of methods 500 and 700 can uniquely identify a defective cell N.

FIG. 13 illustrates the application of the method 500. In the following example, the test pattern generation method is performed to detect a stuck-at-0 fault in faulty scan chain 1310. In FIG. 13, the test pattern generation method 500 constrains the scan-in values on scan cells N−x, N−x−1, N−x−2, . . . , 0 to "0" such that the chain diagnosis pattern causes "0"s to be output from the scan cells into system logic 1320 once the test pattern is loaded into the faulty scan chain and the capture phase begins. Further, the test pattern generated by the method 500 causes a "1" to be loaded into the scan cell N−x during the capture phase of testing with the test pattern (e.g., using scan-in load values from other scan cell in the circuit-under-test). To perform diagnosis, the value loaded into scan cell N−x can be examined. If the value "1" is observed at cell N−x, then it can be determined that the defect is upstream of cell N−x. If the value "0" is observed at cell N−x, then it can be determined that the defect is on cell N−x or a downstream cell and testing can be continued.

FIG. 14 illustrates the application of the method 700. In FIG. 14, the test pattern generation method 700 constrains the scan-in values on scan cells N−1, N−2, N−3, . . . , 0 to "0" such that the chain diagnosis pattern causes "0"s to be output from the scan cells into system logic 1320 once the test pattern is loaded into the faulty scan chain 1310. Further, the test pattern generation method 600 constrains scan cells N−x, N−x+1, N−x+2, . . . N, N+1, . . . L−1 to be considered unobservable. (Constraining selected scan cells to be unobservable during test pattern generation is a common setting allowed by many ATPG software tools.) The test pattern generated by the method 700 also causes a "1" to be output from the scan cell N during the capture phase of testing with the test pattern. Thus, a "1" is included in the original test pattern shifted into the scan cell N during the shift phase. In the illustrated example, the value "1" (or a valuable directly attributable to the value "1") is loaded into a scan cell in another scan chain (e.g., scan cell M−1) and/or into a scan cell of the faulty scan chain that is downstream of scan cell N−x (e.g., scan cell N−x−1). To perform diagnosis, the value loaded into the scan cell potentially capturing the fault effect can be examined. For example, if a fault effect is observed at scan cell M−1 or scan cell N−x−1, in this example, then it can be determined that the defect is in scan cell N; otherwise, it can be determined that the defect is downstream of scan cell N and testing can be continued.

Figure 17:
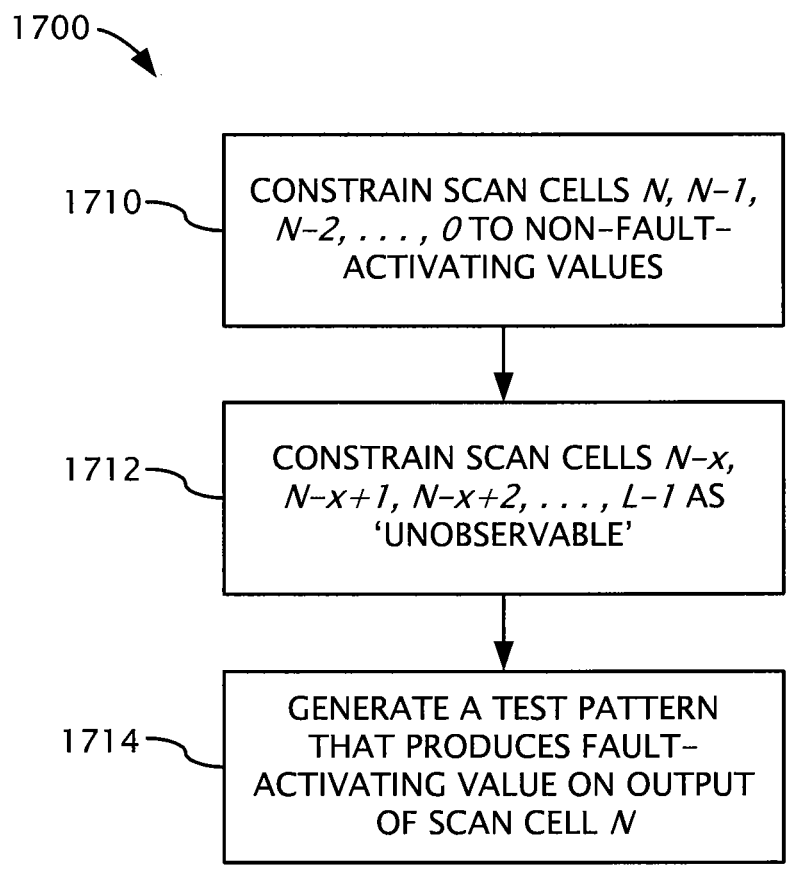
FIG. 17 is a flow chart of a more generalized test pattern generation method than the method shown in FIG. 7.

The exemplary methods introduced above assume that there are no inversions or only even numbers of inversions between scan cells of the faulty scan chain. For situations where odd numbers of inversions are present in the scan chain, the methods can be modified to account for the inversions. FIG. 17 is a flowchart of an exemplary method 1700 that represents a more generalized test pattern generation method than the method 700 and that is suitable for situations where inversions are desirably accounted for. For illustrative purposes, the method 1700 is described in the context of detecting a stuck-at-v fault for a scan cell N in a scan chain. It should be understood that wherever method 700 is discussed in this disclosure, it can be substituted by method 1700.

At 1710, the load values for scan cells N−1, N−2, . . . , 0 are constrained to values selected to not activate the targeted fault at scan cell N.

At 1712, upstream scan cells N−x, N−x+1, N−x+2, . . . , L−1 are constrained (or otherwise classified) as "unobservable."

At 1714, a test pattern having these constraints is generated to detect that targeted stuck-at-v fault at the data output of cell N. That is, a test pattern is generated (e.g., using an ATPG tool) that produces the value 1−v at the output of cell N once the test pattern has been loaded and that propagates that value (or the effect of the value) to an observable scan cell during a capture phase of testing (e.g., in a different scan chain or in one of scan cells N−x, N−x−1, . . . , 0).

VI. Diagnostic ATPG Flow

Figure 8:
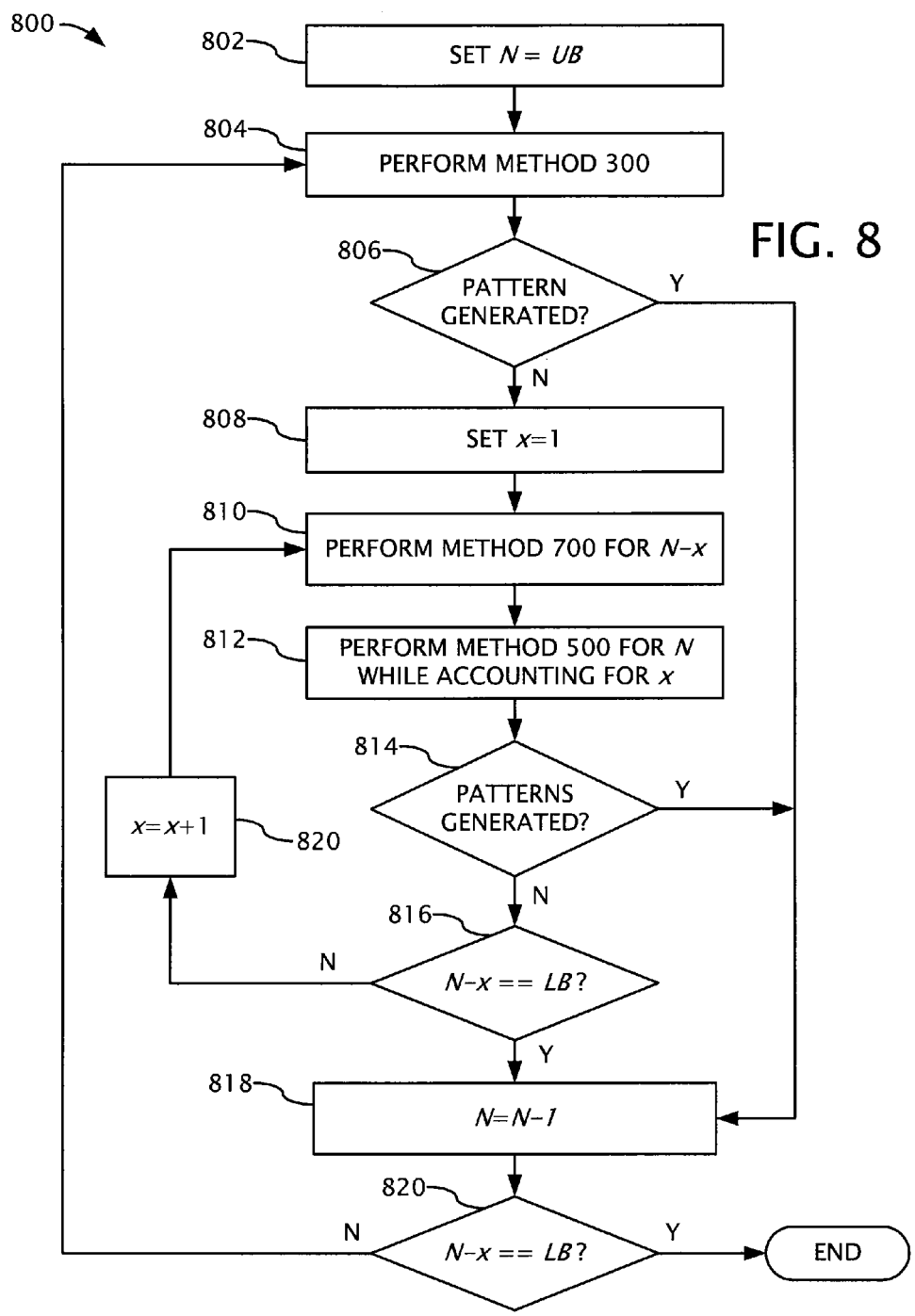
FIG. 8 is a flow chart of a second method for generating a complete set of chain diagnosis test patterns according to the disclosed technology.

FIG. 8 shows an exemplary embodiment of an overall diagnostic test generation method 800 that incorporates embodiments of the procedures introduced in the previous sections. The exemplary flow 800 starts with the upper-bound scan cell (UB) and progresses incrementally toward the lower-bound scan cell (LB), though in other embodiments the targeted scan cell is selected in a different order. For each target scan cell N, the exemplary flow 800 calls the test generation procedure 300 (e.g., Test_Gen_For_Target_Cell (N, v)) to differentiate cell N from all its downstream scan cells. In case the procedure fails to create a test pattern, the exemplary flow calls the test generation procedures 500 and 700 to generate test patterns for scan cell N. For example, in the particular embodiment illustrated, exemplary procedure 500 is used to differentiate scan cell N from scan cells N−x−1, N−x−2, . . . , 0 while exemplary procedure 700 is used to differentiate cell N from cells N−1, N−2, . . . , N−x.

In the particular implementation shown in FIG. 8, at 802, the target index N is set to the upper-bound scan cell. At 804, the method 300 is performed for scan cell N. At 806, a determination is made as to whether a pattern was generated for scan cell N. In some embodiments, the method 300 is performed until a time limit (e.g., a CPU time limit), a backtracking limit, or a memory usage limit (any of which may be preset or user defined) is met. If the limit is exceeded, the determination is made at 806 that a pattern could not be generated. If a pattern is generated, then method 800 proceeds to method act 818 where the target index N is decremented by one. If a pattern was not generated at 804, then the method 800 continues at 808. At 808, variable x is set to 1. At 810, the method 700 is performed with scan cell N−x being the scan cell to be differentiated from scan cell N. For example, the Cell_Pair_Differentiation(N, N−x, stuck-at-v) procedure can be called. At 812, the method 500 is performed for scan cell N while accounting for the value of x. For example, the procedure Extended_Test_Gen_for_Target_Cell(N, N−x−1, stuck-at-v) can be called. At 814, a determination is made as to whether test patterns were generated using the methods 700 and 500. If so, then the method 800 proceeds to method 818 where the target index N is decremented by one. If test patterns were not generated, a determination is made as to whether the value N−x is the lower-bound value (LB) at 816. If N−x is not the lower-bound value (LB), then the variable x is incremented by one and the method 800 returns to 810. If N−x is the lower bound value, then test patterns cannot be generated for the scan cell N and the target index N is decremented by one at 818. At 820, a determination is made as to whether the target index N is the lower-bound value (LB). If so, then the method 800 terminates; otherwise, the method 800 returns to 804 where the method 300 is performed for the next targeted scan cell (scan cell N).

In order to better evaluate how an embodiment of the test generation procedure 300 (and in particular the implementation described as Test_Gen_For_Target_Cell(N, v) in Table 2 above) works, experimental data was collected for two different designs. For each design, fifty scan cells were randomly selected which were shown to have multiple scan cells as diagnosis candidates by using production test patterns. Diagnostic test generation was then performed on these scan cells. The numbers of scan cells that were successfully targeted by exemplary procedure 300, 500, and 700 were then recorded. The results are shown in Table 6. From Table 6, it can be observed that chain diagnosis test pattern generation method Test_Gen_For_Target_Cell(N, v) was successful for more than 97% of target scan cells while less than 3% of scan cells required test pattern generation by the procedures 500 and 700.

TABLE 6

Scan cells successfully targeted by using the various procedures

|  | % of scan cells by Method 300 | % of scan cells by Method 500 and 700 |
|---|---|---|
| Circuit A |  |  |
| #Gates = 700K | 98.9% | 1.1% |
| #Chains = 27 |  |  |
| #Len = 429 |  |  |
| Circuit B |  |  |
| #Gates = 500K | 97.5% | 2.5% |
| #Chains = 16 |  |  |
| #Len = 2600 |  |  |

VII. Exemplary Modifications of the Diagnostic ATPG Techniques

A. Timing Failures

With minor modifications, embodiments of the test pattern generation techniques introduced above can generate diagnostic test patterns for timing fault models. In this section, a fast-to-rise fault is used as an example to explain how to generate test patterns for timing fault models. Constraints for other timing fault models can be analyzed similarly.

When there is a fast-to-rise fault on scan cell N, a 0-to-1 transition on this scan cell happens one cycle earlier, which causes the wrong value to be shifted out of the scan cell during scan shift process. This is usually caused by a race condition between the data and scan clock which causes a hold-time violation for the 0-to-1 transition. Similar to the analysis for stuck-at fault diagnostic test generation, to differentiate a pair of scan cells N and M with fast-to-rise faults, a test pattern should create different faulty circuit responses for faulty circuits $F_N$ and $F_M$.

As for ATPG constraints for scan load values, while targeting scan cell N, scan cell N and its downstream scan cells can be constrained to non-fault-activating values. In one exemplary embodiment, for a fast-to-rise fault, the downstream cells are constrained to a value of "1". This is sufficient to ensure that no fault activation occurs for downstream scan cells during the scan load process. With these constraints, an attempt can be made to generate a test pattern that captures a "1" into scan cell N and a "0" into scan cell N−1. If such a test pattern is generated, it provides sufficient conditions to differentiate scan cell N from all its downstream scan cells. The reason is that if there is a defect on scan cell N, a failure at scan cell N−1 will not be observed after applying the test pattern on a tester. Otherwise, a failure will be observed at scan cell N−1.

In situations where a test pattern cannot be generated that loads a "1" in scan cell N and a "0" into scan cell N−1, the methods 500 and 700 introduced above can be used for transition faults with minor modification. In particular, and using a fast-to-rise fault by way of example, method 500 can be adapted for the fast-to-rise fault by constraining the scan cell N−x as well its downstream scan cells to "1", and then generating a test pattern that captures a "0" into scan cell N−x and a "1" into scan cell N−x+1. Method 700 can similarly be adapted by constraining scan load values of scan cell N−1, N−2, . . . , 0 to "1", constraining upstream scan cells N−x, N−x+1, N−x+2, . . . , L−1 as unobservable, and generating a test pattern that loads a "0" into scan cell N and causes a "1" to be captured into scan cell N during a capture phase (e.g., by constraining scan-in load values of other scan cells in the circuit-under-test). As will be readily understood by those skilled in the art, the particular values will change depending on the targeted fault.

As for ATPG constraints for failure observation during timing fault pattern generation, the constraints on failure observation are not as strict as for stuck-at fault test generation. For example, upstream scan cells of a target scan cell can be used for failure observation even though they may be impacted by the defect during scan unload process. The reason is that the upstream cell values are not completely corrupted. They still can be used for failure observation after reversing the impact of the fault in the target scan cell during the scan unload process. However, for fault effects propagated to upstream scan cells, it is desirable to make sure that there is no aliasing that might cause the fault effect to be masked during the scan unload process. For example, to avoid aliasing, once a test pattern is generated and it is known which upstream scan cell (say cell N+y) captures a fault effect, the capture value of the cell next to it can be checked in order to make sure there is no opposite transition to cause the fault effect of cell N+y to be masked during scan unload. For a fast-to-rise fault at scan cell N, for example, assume the fault effect is propagated to scan cell N+y and the capture value of N+y is "0" in faulty circuit $F_N$. If the capture value for scan cell N+y+1 is "1" in both good circuit and faulty circuit $F_N$, then this pattern will cause aliasing during the scan unload process because the fast-to-rise fault at cell N will cause the observed value of scan cell N+y to be "1", which is the same as its good circuit value. If a test pattern causes fault masking, then in one exemplary embodiment, this pattern should be discarded and a new test pattern generated with scan cell N+y masked as unobservable.

B. Multiple Failing Scan Chains

In case multiple scan chains fail on the same die, it is preferred to diagnose all the failing scan cells before physical fault isolation. The diagnosis flow explained in the previous section can be extended to deal with multiple failing scan chains. For instance, a single failing scan chain can be targeted by the diagnostic test generation procedure, and constraints can be added to the other failing scan chains. For example, conservative constraints can be used for all non-targeted failing scan chains (e.g., scan cells on non-targeted faulty scan chains can be constrained to be uncontrollable and unobservable during the ATPG process).

C. Designs with Embedded Compressions

With the increase of design size and the importance of at-speed testing and multiple-detect testing, test data volume often exceeds the capacities of automatic test equipment (ATE). Due to the limited bandwidth between the IC and the ATE, this increased test data also results in increased test time and hence increased test costs.

Several embedded compression techniques (e.g., Embedded Deterministic Test (EDT)) have been developed to contain the test costs while achieving the desired test quality levels. These compression techniques involve two complementary aspects: hardware that is placed on chip, and software ATPG techniques that exploit the on-chip hardware to create highly compressed test sets that produce dramatic reductions in test data volume and test application time. In EDT for example, a hardware block (typically called the decompressor) is placed along the scan path between the scan input channels and inputs of the scan chains. This decompressor performs a transformation of the data that is supplied by the ATE on a few scan input channels and feeds the large number of internal scan chains. Another hardware block (typically called the compactor) is placed along the scan path on the output side and performs the reverse transformation. The compactor transforms the data captured in the large number of internal scan chains into a data stream that is delivered on few scan output channels for comparison with the expected values by the ATE. EDT has successfully been adopted by many companies to achieve dramatic reduction in test data volume and test application time.

Figure 9:
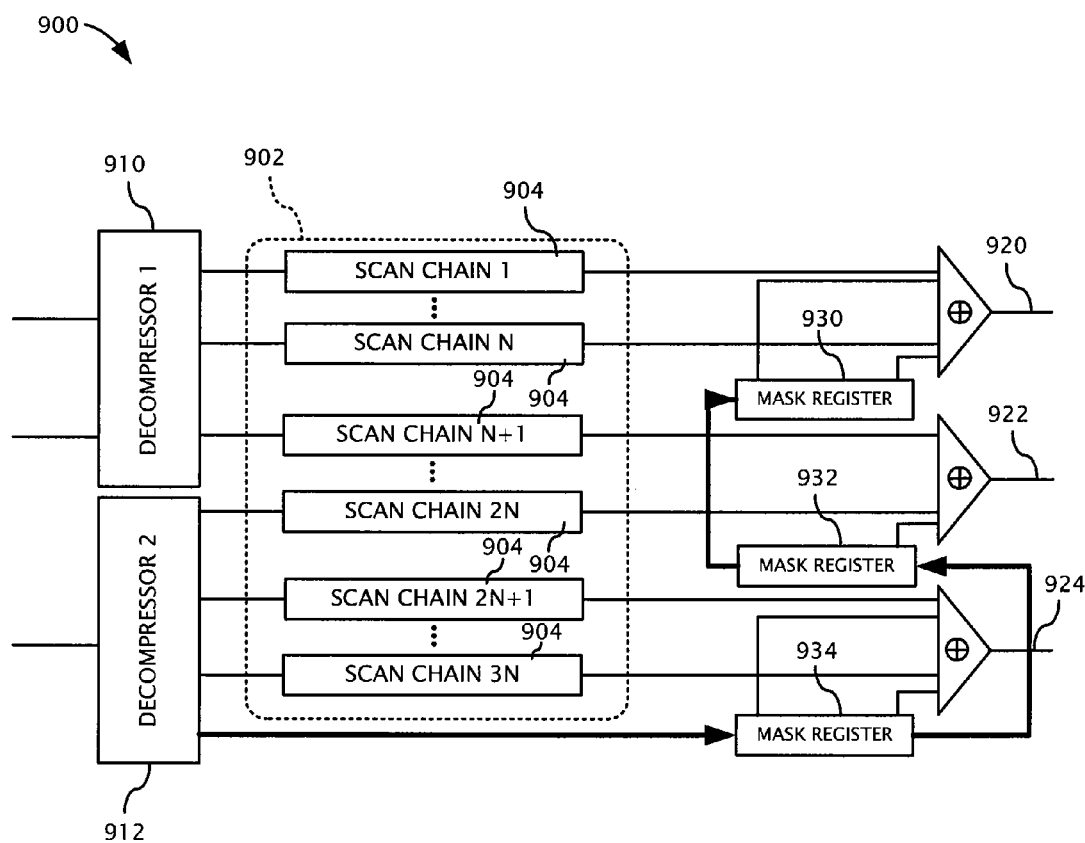
FIG. 9 is a schematic block diagram of a circuit having embedded compression hardware that can be tested using chain diagnosis test patterns generated by embodiments of the disclosed technology.

An example of an EDT design is illustrated in FIG. 9. In the illustrated design, circuit 900 has two decompressor segments 910, 912 at the input of a circuit-under-test 902, which comprises multiple scan chains 904. The circuit 900 further comprises three compactor channels 920, 922, 924 at the outputs of the circuit-under-test 902. If a group of the scan chains 904 are compacted through the same compactor, these scan chains are said to be on the same channel. In the illustrated embodiment, the values in mask registers 930, 932, 934 are used to control each compactor to selectively compact all or a subset of internal scan chains. In particular embodiments, the values in the mask registers 930, 932, 934 are part of the decompressed patterns.

To extend the previously proposed chain diagnostic ATPG algorithm on EDT designs, the decompressors and compactors can be taken into account. According to one exemplary embodiment, to get compressed patterns, a set of equations is solved based on the decompressor structure (see, e.g., J. Rajski, J. Tyszer, M. Kassab, N. Mukherjee, R. Thompson, H. Tsai, A. Hertwig, N. Tamarapalli, G Eide, and J. Qian, "*Embedded Deterministic Test for Low Cost Manufacturing Test,*" *Proc. ITC*, pp. 301-310 (2002) and U.S. Pat. No. 6,327,687, both of which are hereby incorporated herein by reference). Note that the equations for the decompressor should include the desired cell constraints discussed above for the exemplary ATPG flow. For example, these cell constraints can be added into the decompressor equations such that the compressed ATPG patterns will satisfy all specified cell constraints after decompression.

When the method to differentiate scan cells through data capture is applied, the failure from the faulty scan chain should be observed. Thus, during diagnostic ATPG the values in the mask register are desirably selected so that the failure on the faulty chain will be observed. For example, if only one chain has a defect, the specific faulty chain can be observed alone or as one of multiple chains that output through the same channel. When multiple faulty chains in the same channel are observed, patterns are desirably generated that observe one faulty chain at a time in order to avoid interference between different faulty chains in the same channel.

When the method to differentiate scan cells through fault propagation is applied, the reliable observation points may need to be redefined for EDT designs or other designs with compression hardware. For example, primary outputs and good chains that are not in the same channel as the faulty chain can be used as reliable observation points. For example, for scan chains that are in the same channel as the faulty chain, only scan cells from the scan cells downstream of the target scan cell can be designated as reliable observation points. For the example EDT design shown in FIG. 9, for instance, chain 1 through chain N are in the same channel. Assume that only Chain 1 is a faulty chain and that scan cell 100 in Chain 1 is being targeted. In this example, the POs and the scan cells in Chain N+1, Chain N+2, . . . , Chain 3N can be used as reliable observation points, but only the scan cells from 0 to 99 on Chain 1, Chain 2, . . . , Chain N can be reliably observed. Note that although Chain 2, Chain 3, . . . , Chain N are good chains, they are in the same channel as the faulty chain (Chain 1). Thus, scan cell 100 and its upstream scan cells in each of these good chains are not reliably observed at the compactor channel output due to the fault on Chain 1.

VIII. Experimental Results

Simulations were performed on several industrial designs to evaluate the effectiveness of exemplary embodiments of the disclosed techniques. The results of these experiments are presented in this section.

In one experiment, for each circuit, scan chain failure diagnosis using production scan test patterns was run based on failures created from scan cell stuck-at fault simulations on randomly selected scan cells. The scan chain diagnosis tool used in the experiment was based on the techniques reported in R. Guo, S. Venkataraman, "*A Technique For Fault Diagnosis of Defects in Scan Chains,*" *Proc. ITC*, pp. 268-277 (2001); and Y. Huang, W.-T. Cheng, S. M. Reddy, C.-J. Hsieh, Y.-T. Hung, "*Statistical Diagnosis for Intermittent Scan Chain Hold-Time Fault,*" *Proc. ITC*, pp. 319-328 (2003). After diagnosis, it was observed that in many cases, the diagnosis results contained tens of scan cells as candidates. Five cases which had more than three candidate scan cells were randomly selected to evaluate the effectiveness of an exemplary embodiment of the disclosed diagnostic test generation algorithm (in particular, the embodiment illustrated in FIG. 8).

Table 7 and Table 8 show the results on two industrial designs (Circuit A and Circuit B) with regular scan architecture without any scan compression logic. Table 9 shows the results on an industrial design with scan compression logic using an EDT architecture. For each circuit, the following information is provided in Tables 7-9: the number of logic gates in the design, the number of scan chains, and the scan chain lengths. In each table, the first column shows the number of original production scan test patterns used in this experiment. The second column shows the numbers of candidate cells by using the original test patterns. The numbers of candidates range from four scan cells up to more than a hundred scan cells. The large number of candidate cells confirmed that production test patterns are not effective diagnostic test patterns for scan chain failures. Diagnostic test generation using an exemplary embodiment of the disclosed technology (the method shown in FIG. 8) was then performed to generate chain diagnostic test patterns targeting these candidate scan cells. The third column shows the number of diagnostic test patterns created by the exemplary technique. Note that with the exemplary technique, it is possible that multiple test patterns may be generated for a single scan cell. This explains why the number of diagnostic test patterns created by the exemplary technique could be slightly higher than the number of candidate scan cells. The fourth column shows the numbers of diagnosis candidate cells reported when using the newly created test patterns. For all the test cases shown in Table 7, Table 8, and Table 9, the exemplary technique generated test patterns that led to no more than three candidate scan cells. The improved diagnostic resolution shows the effectiveness of the exemplary technique. Note also that diagnostic test generation usually targets a small number of faults, and test generation can be finished in a few minutes.

The experiments also consisted of implementing the Kundu diagnostic test generation algorithm and comparing it with the exemplary technique. The fifth and sixth columns of Tables 7 and 8 show the number of diagnostic test patterns and the number of candidate cells by the Kundu test generation algorithm. For all cases in Table 7 and one test case in Table 8, the Kundu algorithm created test patterns that reduced the candidates down to a single candidate scan cell. In the cases considered in Table 7, the scan cells were not correlated to neighbor scan cells through combinational logic. Thus, the results in Table 7 show that when scan cells on the same scan chain are not correlated to their neighbor scan cells through combinational logic, test patterns generated by the exemplary embodiment achieve diagnosis resolution as good as the Kundu algorithm. However, for 4 out of 5 cases in Table 8, the test patterns generated by the Kundu algorithm failed to improve the diagnostic resolution down to a few scan cells. By contrast, the test patterns generated by the exemplary embodiment disclosed herein improved diagnostic resolution down to a single scan cell for all of the five cases. Further analysis on the scan cells that were randomly selected in the experiment showed that the target scan cells were closely correlated through combinational logic. By generating test patterns to differentiate a target scan cell from its neighbor scan cells, the defect could be successfully isolated to a single scan cell. Even though a similar number of test patterns were generated by the Kundu algorithm, the patterns were not able to distinguish a scan cell from its neighbor cells.

In further experiments, an exemplary embodiment of the disclosed technology (in particular, the embodiment illustrated in FIG. 8) was compared with the Kundu algorithm by checking the average number of diagnostic candidate scan cells for circuit A and circuit B. In particular, 50 scan cells from each circuit were randomly selected and diagnosis was performed using the original test patterns. For the scan cells that resulted in more than one candidate cell, test pattern generation was then performed using the exemplary embodiment of the disclosed technology and the Kundu algorithm. Diagnosis was then performed using the newly generated test patterns. The average number of diagnosis candidate cells for these 50 scan cells were calculated for each of the different test pattern sets. The results are shown in Table 10. The second row in Table 10 shows that the average number of diagnostic candidates for Circuit A was reduced from 9.39 to 1.00 using the exemplary embodiment of the disclosed technology and the Kundu algorithm. For circuit B, test patterns generated by the exemplary embodiment effectively reduced the average number of diagnosis candidates from 17.84 to 1.02 while the test patterns generated by the Kundu algorithm only reduced the average number of candidate cells to 15.47.

TABLE 7

Experimental results on Circuit A
Circuit A: #Gate = 700K, #Chain = 27, #Len = 429

| Orig. #Pat | Orig. #Cand | Ex. Emb. #Pat | Ex. Emb. #Cand | Kundu #Pat | Kundu #Cand |
|---|---|---|---|---|---|
| 1619 | 4 | 4 | 1 | 4 | 1 |
| 1619 | 33 | 33 | 1 | 33 | 1 |
| 1619 | 33 | 33 | 1 | 33 | 1 |
| 1619 | 26 | 26 | 1 | 26 | 1 |
| 1619 | 37 | 37 | 1 | 37 | 1 |

TABLE 8

Experimental Results on Circuit B
Circuit B: #Gate = 500K, #Chain = 16, #Len = 2600

| Orig. #Pat | Orig. #Cand | Ex. Emb. #Pat | Ex. Emb. #Cand | Kundu #Pat | Kundu #Cand |
|---|---|---|---|---|---|
| 500 | 43 | 43 | 1 | 43 | 41 |
| 500 | 27 | 27 | 1 | 27 | 18 |
| 500 | 27 | 27 | 1 | 27 | 1 |
| 500 | 43 | 43 | 1 | 43 | 43 |
| 500 | 129 | 129 | 1 | 129 | 128 |

TABLE 9

Experimental Results on EDT Circuit C
Circuit C: #Gates = 1.2M, #Chain = 360,
Length = 204, CompactRatio = 10x

| Orig. #Pat | Orig. #Cand | Ex. Emb. #Pat | Ex. Emb. #Cand |
|---|---|---|---|
| 128 | 33 | 33 | 1 |
| 128 | 16 | 16 | 1 |
| 128 | 12 | 14 | 3 |
| 128 | 25 | 26 | 1 |
| 128 | 20 | 20 | 1 |

TABLE 10

Average Number of Diagnosis Candidates

| | Original Pat #CandCell | Ex. Emb. #CandCell | Kundu #CandCell |
|---|---|---|---|
| Circuit A | 9.39 | 1.00 | 1.00 |
| Circuit B | 17.84 | 1.02 | 15.47 |

IX. Using Multi-Capture-Cycle Scan Patterns

Although in at least some cases a complete test set can be created using, for example, the methods 500 and 700, these methods do not necessarily provide sufficient conditions for scan patterns with multiple capture cycles. In some cases, if scan cells N through 0 are constrained to v, for some scan cells it will be difficult (or, sometimes, impossible) to capture 1−v into scan cell N−1 in just one capture cycle. Accordingly, in such cases the methods 500 and 700 will not necessarily generate effective test patterns for some scan cells in a chain.

Figure 18:
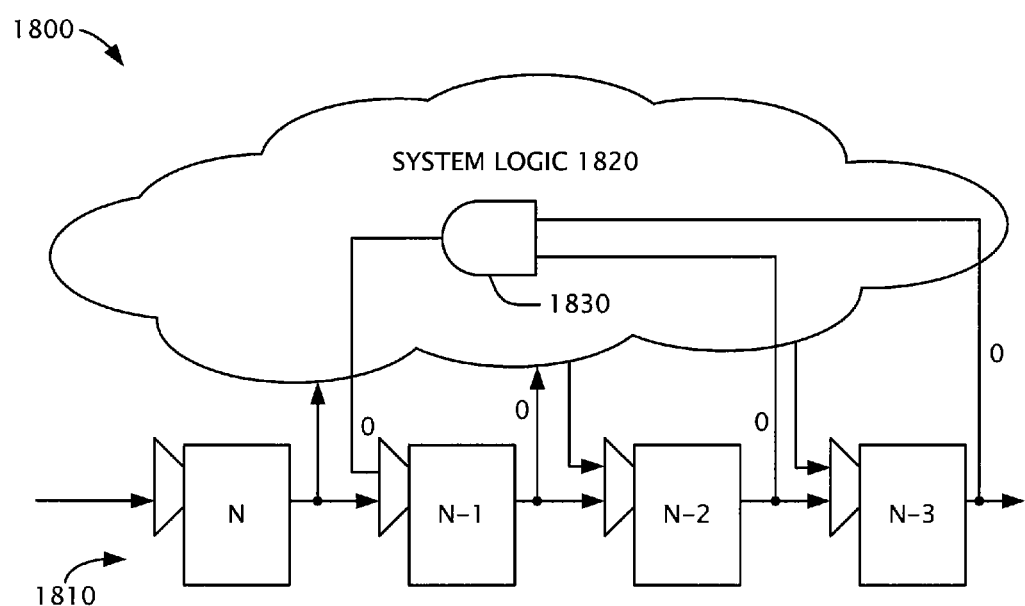
FIG. 18 is a schematic block diagram of a circuit.

For example, FIG. 18 shows an exemplary schematic block diagram 1800 with a faulty scan chain 1810 coupled to system logic 1820. If scan cells N through 0 of the chain 1810 are load constrained to "0", it is not possible in a single capture cycle to capture "1" into scan cell N−1, since the AND gate 1830 is coupled to the input of scan cell N−1 and the outputs of scan cells N−2 and N−3. Instead, scan cell N−1 will capture "0" if a "0" is present on one or both of the outputs of scan cells N−2 and N−3 at a first capture cycle. So, capturing "1" into the scan cell N−1 requires additional capture cycles. For example, depending on the configuration of the system logic 1820, a second capture cycle might capture "1" into the scan cell N−2 and "0" into the scan cell N−3. A third capture cycle might capture "1's" into both scan cells N−2, N−3, thus also capturing "1" into scan cell N−1.

Although the particular example of FIG. 18 shows the system logic 1820 as comprising the AND gate 1830, in further embodiments the system logic 1820 comprises one or more other components.

Referring again to FIGS. 2(*a*) and 2(*b*), for patterns with more than one capture cycle, in at least some cases extra restraints are needed to ensure, for example, that a fault on scan cell N does not propagate to scan cell N−1. In some embodiments, if no constraints are placed on at least some scan cells for cycles after the scan load cycle, a stuck-at-v fault on scan cell N could propagate to scan cell N−1, precluding capturing 1−v into scan cell N−1. In at least some embodiments, a test pattern is generated assuming unknown content of scan cell N to prevent the fault effect of this cell from propagating to scan cell N−1. This additional constraint allows scan cell N−1 to capture a valid value of 1−v even if scan cell N is faulty. Accordingly, test patterns can be generated that allow for differentiating scan cell N from its downstream scan cells.

Figure 19:
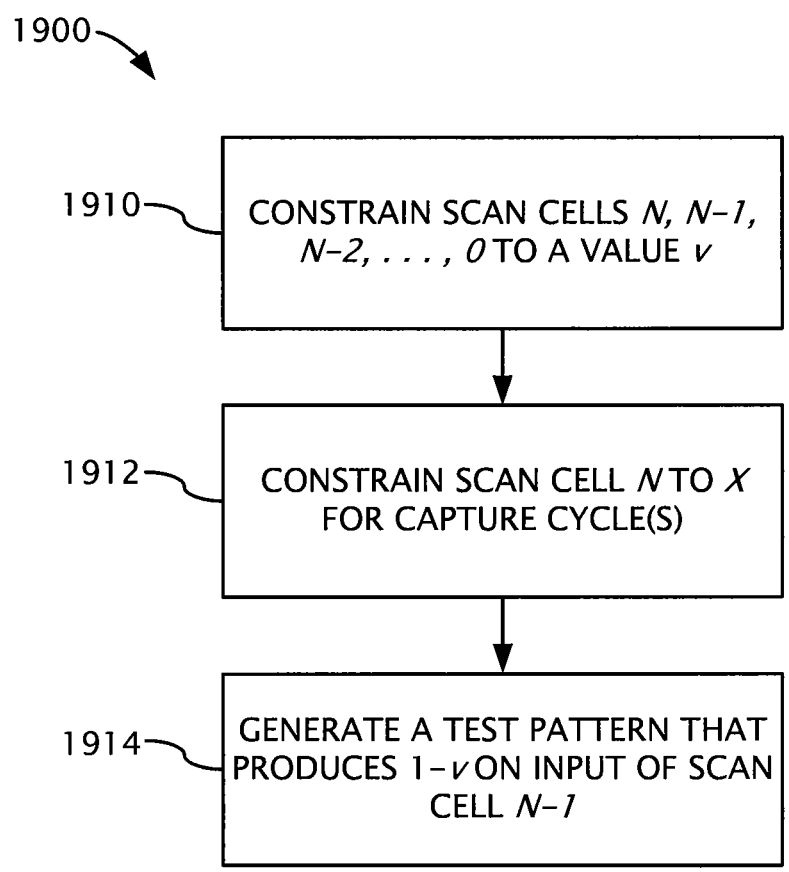
FIG. 19 is a flow chart of a fourth method for generating a complete set of chain diagnosis test patterns according to the disclosed technology.

FIG. 19 is a flowchart of an exemplary embodiment of a method 1900 for generating a test pattern (e.g., a test pattern suitable for the scenario described above for FIG. 18). For purposes of this discussion, it is assumed that there is an even number of inversions between a scan cell and a scan chain output. In practice, when there is an odd number of inversions between a scan cell and scan chain output, the impact of the inversions should be considered. At 1910, for a targeted scan cell N, scan load values for cells N, N−1, N−2, . . . , 0 are constrained to a non-fault activating value v. In some embodiments, load values for only a portion of scan cells N, N−1, N−2, . . . , 0 (such as at least N and N−1) are constrained to v. At 1912, the scan cell N is masked by constraining its value to an unknown value X for at least one capture cycle (e.g., for all capture cycles). At 1914, a test pattern is generated with one or more capture cycles that captures a value 1−v on the data input of scan cell N−1, with the value of cell N set to X during the one or more capture cycles.

Pseudocode for an exemplary embodiment of the method 1900 appears in Table 11 below:

TABLE 11

Exemplary pseudocode for a targeting a scan cell N with one or more capture cycles Test_Gen_for_Target_Cell_Input (N, stuck-at-v):
• Constrain scan load values of scan cells N, N−1, N−2, . . . , 0 to non-fault-activating value v;
• Mask scan cell N by setting it to unknown value X for all capture cycles;
• Generate a test pattern with one or more capture cycles to capture fault-activating value 1−v on data (functional) input of scan cell N−1.

It can be shown that the constraints used in the method 1900 are sufficient to differentiate scan cell N from downstream cells, even if multiple capture cycles are used. For example, it can be shown that the test response of a faulty circuit with a fault at scan cell N ($F_N$) is different from the test response of a faulty circuit with a fault at scan cell N−1 ($F_{N-1}$), N−2 ($F_{N-2}$), . . . , or 0 ($F_0$). If a fault is at scan cell N, the constraints of the method 1900 cause scan cell N−1 to capture value 1−v. The captured value 1−v on scan cell N−1 is then correctly shifted out and observed during scan unload. This confirms that there is no failure observed at scan cell N−1 for the selected error type, since the fault is at scan cell N. If the fault is at any scan cell downstream of scan cell N, the unload value of scan cell N−1 will be an incorrect value v.

In at least some cases, a test pattern generated by the method 1900 can guarantee to differentiate scan cell N from downstream scan cells; if all scan cells in a range of suspect cells are successfully targeted by this procedure, each scan cell will have a unique faulty behavior for a given test pattern set and a complete diagnostic test set for the range will be obtained.

In generating a multi-capture-cycle scan test pattern (e.g., as described in the method 1900), it is sometimes necessary to determine a number of capture cycles that are needed to generate the pattern. This number of cycles is sometimes called the "sequential depth" of the test. A number of different methods can be used to determine a sequential depth for generating a given test. In at least some embodiments, patterns can be generated by increasing the sequential depth of the patterns (e.g., one cycle at a time, two cycles at a time, three cycles at a time, or by other amounts). However, it is often beneficial to avoid attempting to generate a pattern at sequential depths where the pattern cannot (or likely cannot) be generated.

In some embodiments, a minimal sequential depth at which a pattern may exist can be calculated using, for example, a procedure like the one for which pseudocode appears in Table 12. The exemplary procedure of Table 12 uses the "SCOAP" (Sandia Controllability/Observability Analysis Program) concept, but alternate embodiments use other concepts. See Goldstein, "Controllability/Observability Analysis of Digital Circuits," *IEEE Trans. on Circuits and Systems*, Vol. CAS-26, No. 9, pp. 685-693 (September 1979). In Table 12, "C0_depth" of a gate denotes the sequential depth needed to control the output of the gate to "0" and "C1_depth" of a gate denotes the sequential depth needed to control the output of the gate to "1."

TABLE 12

Exemplary pseudocode for determining a minimal sequential depth

• Step 1: Set C0_depth=M and C1_depth=M for all the gates in the design. M is the maximum sequential depth used by the sequential ATPG.
• Step 2: Initialize C0_depth=1 and C1_depth=1 for all the primary inputs (PIs) in the design.
• Step 3: Initialize C0_depth=1 and C1_depth=1 for all scan cells that are not constrained. If the scan cell is constrained to value 1 during scan load, only set C1_depth=1 for this scan cell. If the scan cell is constrained to 0 during scan load, only set C0_depth=1 for this scan cell.
• Step 4: Similar to logic simulation, the calculation of C0_depth and C1_depth (based on the initialized values of PI and scan cells) is performed based on SCOAP concept. For example, for an AND gate, the C0_depth is the minimum of the C0_depth among the input gates. The C1_depth is the maximum of the C1_depth among the input gates. For an OR gate, the C0_depth is the maximum of the C0_depth among the input gates. The C1_depth is the minimum of the C1_depth among the input gates. (The SCOAP concept applies to other gates in the same manner.)
• Step 5: If there is no change of C0_depth or C1_depth in Step 4, stop. Otherwise, return to Step 4.

For the method 1900, in order to generate a test pattern to capture 1−v on a data input of scan cell N−1, a "C(1−v)_depth" of the gate connected to the data input of cell N−1 gives the minimum sequential depth needed to generate such a pattern. An ATPG can then generate a test pattern starting, for example, with this calculated sequential depth. If a C0_depth or C1_depth of the gate connected to cell N–1 is M, this indicates that the data input of cell N–1 cannot be set to a value 1–v within the sequential depth of M. In some embodiments, when the sequential depth given by the procedure is too high, generation of the test is aborted to save run time.

Figure 20:
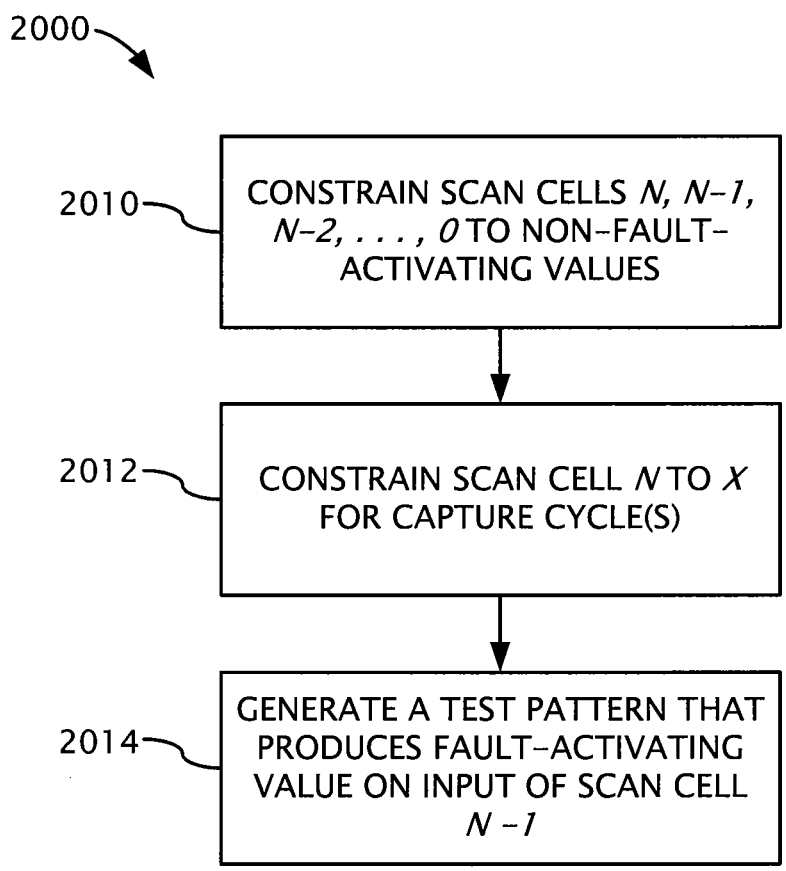
FIG. 20 is a flow chart of a more generalized test pattern generation method than the method shown in FIG. 19.

As mentioned, the exemplary methods introduced above assume that there are no inversions or only an even number of inversions between scan cells of the faulty scan chain. For situations where odd numbers of inversions are present in the scan chain, the methods can be modified to account for the inversions. FIG. 20 is a flowchart of an exemplary method 2000 that represents a more generalized test pattern generation method than the method 1900 and that is suitable for situations where inversions are desirably accounted for. For illustrative purposes, the method 2000 is described in the context of detecting a stuck-at-v fault for a scan cell N in a scan chain. It should be understood that wherever method 1900 is discussed in this disclosure, it can be substituted by method 2000.

At 2010, for a targeted scan cell N, scan load values N, N–1, N–2, ..., 0 are constrained to a non-fault activating values. In some embodiments, only a portion of scan cells N, N–1, N–2, ..., 0 (such as at least N and N–1) are constrained to a load value v. At 2012, the scan cell N is masked by constraining its value to unknown value X for at least one capture cycle (e.g., for all capture cycles). At 2014, a test pattern is generated with one or more capture cycles. The pattern causes a fault-activating value to be captured on the data input of scan cell N–1, with the value of cell N set to unknown value X. Thus, even though N is the scan cell targeted for diagnosis, cell N–1 is targeted for capturing the fault-activating value, which will reveal the existence of a stuck-at-v fault at cell N. The resulting test pattern can then be stored (e.g., on one or more computer-readable media).

Figure 21:
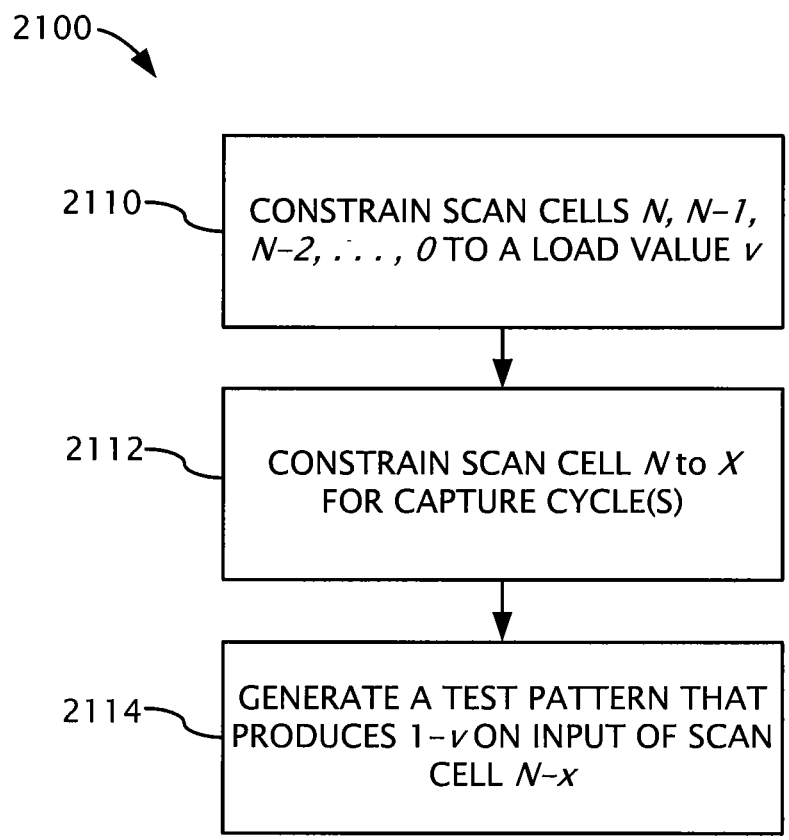
FIG. 21 is a flow chart of a fifth method for generating a complete set of chain diagnosis test patterns according to the disclosed technology.

In some cases, it is possible that the method 1900 will fail to generate a test pattern that differentiates scan cell N from its downstream scan cells. For instance, there are several reasons that the techniques may fail to create a test pattern. One reason is that it may not be possible for a test pattern to meet all the desired constraints. Another reason may be that the test generation program may have reached a time limit (e.g., a CPU time limit), a back-tracking limit, or a memory usage limit (any of which may be preset or set by a user) before a test pattern is generated. FIG. 21 shows an exemplary embodiment of a method 2100 for generating a test pattern that, for a stuck-at-v fault, differentiates a scan cell N from downstream scan cells N–x, N–x–1, ..., 0, where x is a positive integer larger than 1. At 2110, load values of scan cells N, N–1, N–2, ..., 0 are constrained to v. At 2112, the scan cell N is masked by constraining its value to X for one or more capture cycles (e.g., for all capture cycles). At 2114, a test pattern is generated to capture 1–v into the data input of scan cell N–x with the contents of scan cell N set to X.

Pseudocode for an exemplary embodiment of the method 2100 appears in Table 13 below:

TABLE 13

Exemplary pseudocode for a targeting a scan cell N with one or more capture cycles Extended_Test_Gen_for_Cell_Input (N, N–x, stuck-at-v):
• Constrain scan load values of scan cells N, N–1, N–2, ..., 0 to value v;

TABLE 13-continued

Exemplary pseudocode for a targeting a scan cell N with one or more capture cycles

• Mask scan cell N by setting it to unknown value X for all capture cycles;
• Generate a test pattern to capture value 1–v into data (functional) input of scan cell N–x.

In at least some embodiments, the constraints at 2110 and 2112 prevent a stuck-at-v fault at scan cell N from impacting a captured value into cell N–x during scan load and one or more capture cycles. So, if scan cell N is faulty, 1–v will appear on cell N–x after unloading. If scan cell N–x or any of its downstream cells are faulty, v will appear on cell N–x after unloading. Thus, the method 2100 can differentiate scan cell N from scan cells N-x, N–x–1, ..., 0.

Figure 22:
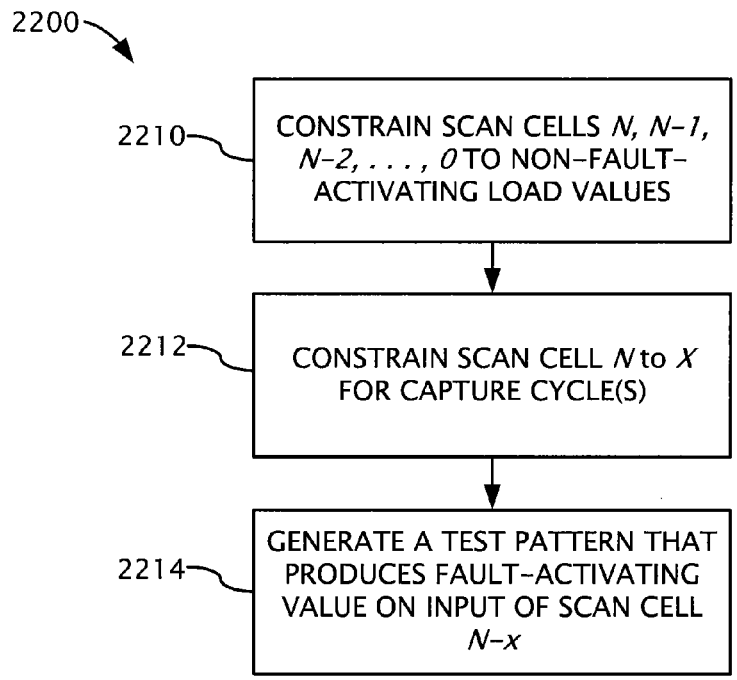
FIG. 22 is a flow chart of a more generalized test pattern generation method than the method shown in FIG. 21.

The exemplary methods introduced above assume that there are no inversions or only an even number of inversions between scan cells of the faulty scan chain. For situations where odd numbers of inversions are present in the scan chain, the methods can be modified to account for the inversions. FIG. 22 is a flowchart of an exemplary method 2200 that represents a more generalized test pattern generation method than the method 2100 and that is suitable for situations where inversions are desirably accounted for. For illustrative purposes, the method 2200 is described in the context of detecting a stuck-at-v fault for a scan cell N in a scan chain. It should be understood that wherever method 2100 is discussed in this disclosure, it can be substituted by method 2200.

At 2210, load values of scan cells N, N–1, N–2, ..., 0 are constrained to non-fault-activating values. At 2212, the scan cell N is masked by constraining its value to X for one or more capture cycles (e.g., for all capture cycles). At 2214, a test pattern is generated to capture a fault-activating-value into the data input of scan cell N–x, where x is an integer greater than 1, with the contents of scan cell N set to X.

In at least some embodiments, the constraints at 2210 and 2212 prevent a stuck-at-v fault at scan cell N from impacting a captured value into cell N–x during scan load and one or more capture cycles. So, if scan cell N is faulty, 1–v will appear on cell N–x after unloading. If scan cell N–x or any of its downstream cells are faulty, v will appear on cell N–x after unloading. Thus, the method 2200 can differentiate scan cell N from scan cells N-x, N–x–1, ..., 0.

Figure 23:
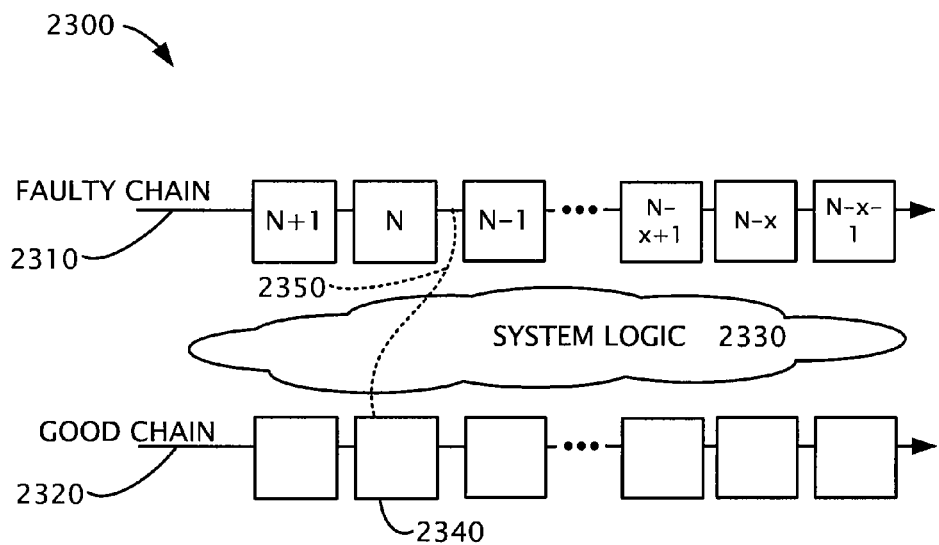
FIG. 23 is a schematic block diagram of a circuit having a faulty scan chain and a non-faulty scan chain.

In some embodiments, a scan cell N can be differentiated from a scan cell N–x over multiple capture cycles using fault propagation, similar to the method 500 discussed above. FIG. 23 shows an exemplary embodiment of a circuit 2300 comprising a faulty chain 2310, a good chain 2320, and system logic 2330 between the chains 2310, 2320. For example, the effect of a fault at the output of scan cell N in chain 2310 can be propagated to a scan cell 2340 in good chain 2320 without activating a fault at, for example, the output of scan cell N–x in chain 2310, as indicated by the dotted line 2350.

Figure 24:
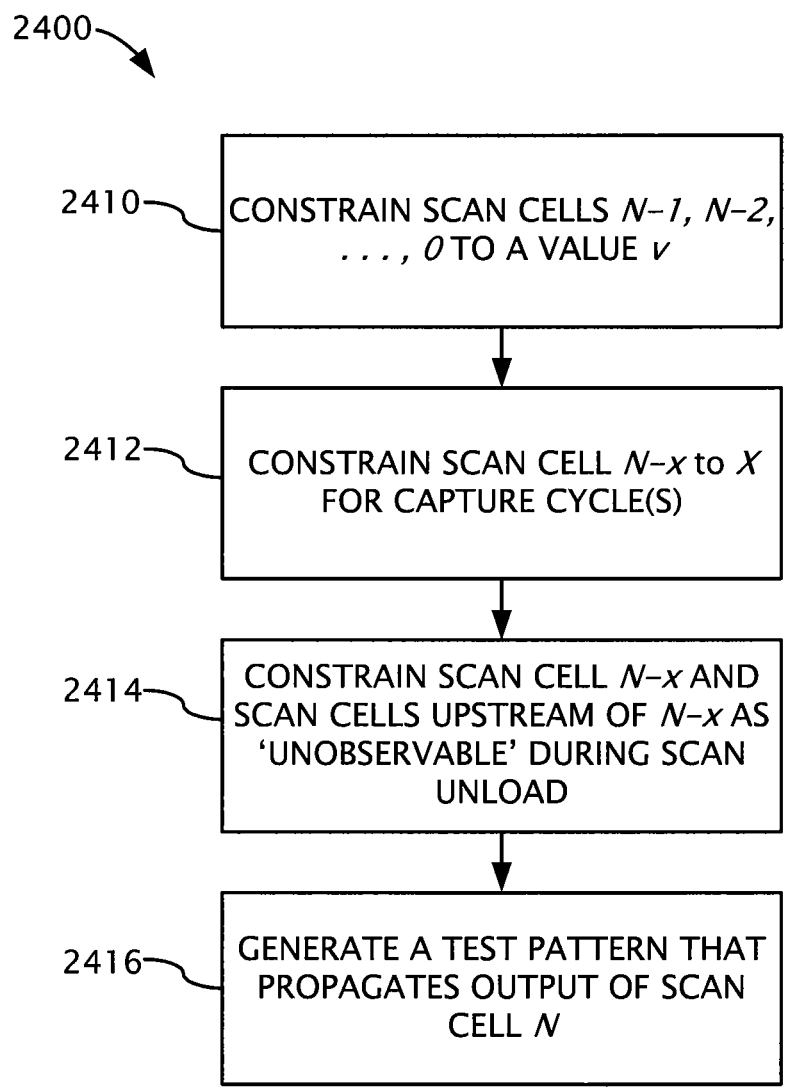
FIG. 24 is a flow chart of a sixth method for generating a complete set of chain diagnosis test patterns according to the disclosed technology.

FIG. 24 shows an exemplary embodiment of a method 2400 for generating a pattern to accomplish this. At 2410, the load values of scan cells N–1, N–2, ..., 0 are constrained to v. In certain implementations, the load value of N is not constrained at 2410. At 2412, the scan cell N–x is masked by constraining it to X for one or more capture cycles (e.g., for all capture cycles). At 2414, scan cell N–x and scan cells upstream of N–x are constrained as unobservable during scan chain unload. At 2416 a test pattern is generated to detect a stuck-at-v fault at the data output of scan cell N by capturing the fault effect (i.e., propagating the fault effect) to a selected observation point. The observation point can be, for example, an observable scan cell (e.g., in the faulty scan chain or in a good scan chain) or a primary output. For 2416, the scan cell N−x is set to X.

When applying a pattern generated by the method 2400, if a fault is located at scan cell N, the pattern causes the fault effect to be propagated to the selected observation point. In at least some cases, this allows for differentiating between failures specific to scan cell N and those specific to scan cell N−x. If the fault is located at scan cell N−x, no faulty value will be observed, since N−x is constrained as unobservable during unload. A pattern generated according to the method 2400 is not necessarily sufficient to differentiate scan cell N from downstream scan cells other than scan cell N−x. Accordingly, in some embodiments, the method 2400 is used in conjunction with one or more other methods described herein.

Pseudocode for an exemplary embodiment of the method 2400 appears in Table 14 below:

TABLE 14

Exemplary pseudocode for a targeting a scan cell N with one or more capture cycles using fault propagation Pair_Diff_Through_Cell_Output(N, N−x, stuck-at-v)
• Constrain scan load values of scan cells N−1, N−2, ..., 0 to value v.
• Mask scan cell N−x by setting it to unknown value X for all capture cycles.
• Constrain upstream scan cells of N−x and scan cell N−x as unobservable during scan unload.
• Generate a test pattern to detect stuck-at-v fault at data output of scan cell N by capturing the fault effect in some observable scan cell or primary output.

Figure 25:
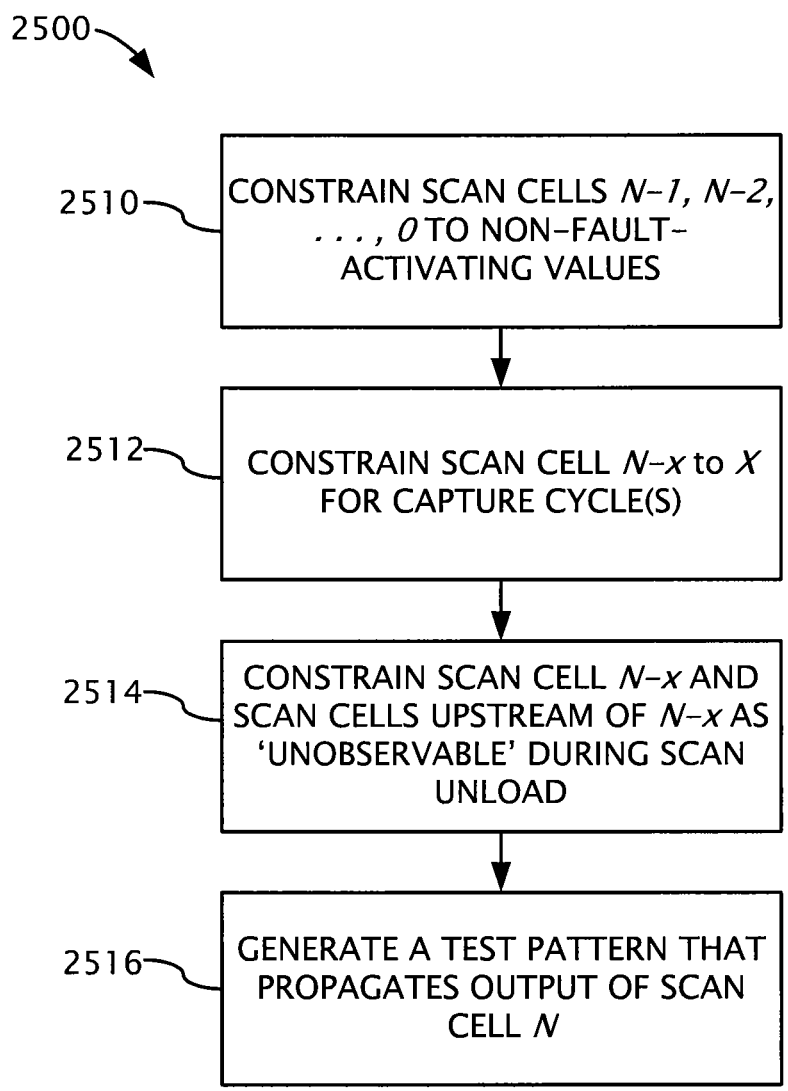
FIG. 25 is a flow chart of a more generalized test pattern generation method than the method shown in FIG. 24.

The exemplary methods introduced above assume that there are no inversions or only an even number of inversions between scan cells of the faulty scan chain. For situations where odd numbers of inversions are present in the scan chain, the methods can be modified to account for the inversions. FIG. 25 is a flowchart of an exemplary method 2500 that represents a more generalized test pattern generation method than the method 2400 and that is suitable for situations where inversions are desirably accounted for. At 2510, the load values of scan cells N−1, N−2, ..., 0 are constrained to non-fault-activating values. At 2512, the scan cell N−x is masked by constraining it to X for one or more capture cycles (e.g., for all capture cycles). At 2514, scan cell N−x and scan cells upstream of N−x are constrained as unobservable during scan chain unload. At 2516 a test pattern is generated to detect a stuck-at-v fault at the data output of scan cell N by capturing the fault effect (i.e., propagating the fault effect) to a selected observation point. In some embodiments (e.g., as shown in FIG. 23), the observable scan cell comprises a scan cell in a scan chain other than the one being tested. For 2516, the scan cell N−x is set to X.

In further embodiments, diagnostic test patterns are generated to locate timing faults. For example, when a scan cell N has a fast-to-rise fault, a 0-to-1 transition occurs early (e.g., one or more cycles early). To differentiate scan cell N from scan cell N−1, a test pattern has different test responses for a faulty circuit with a fault at scan cell N($F_N$) and a faulty circuit with a fault at scan cell N−1($F_{N-1}$).

Figure 26:
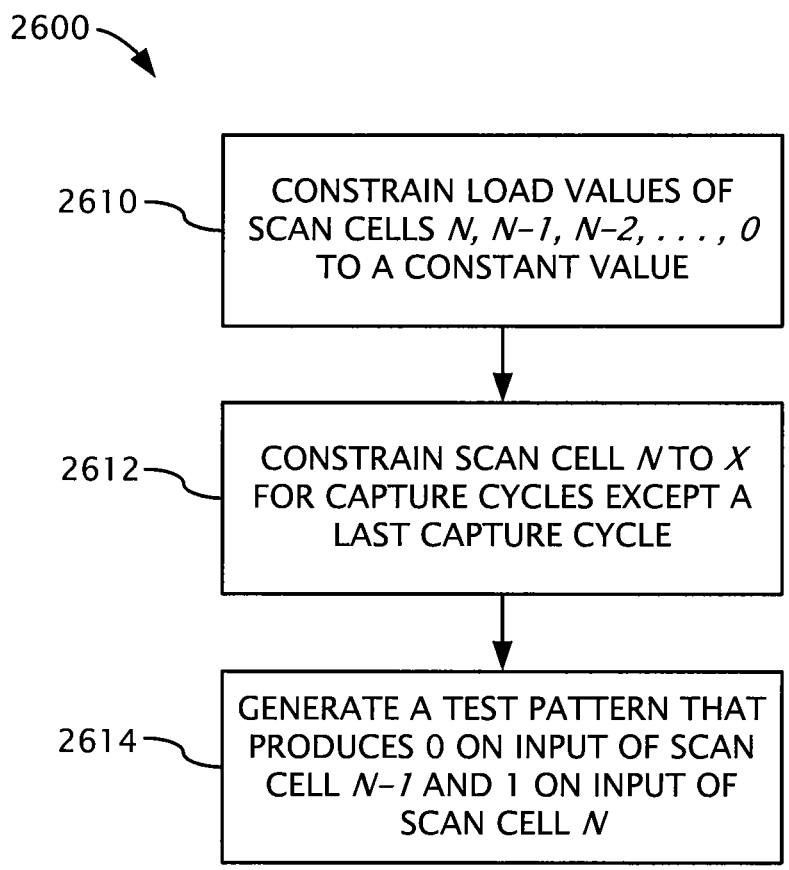
FIG. 26 is a flow chart of a seventh method for generating a complete set of chain diagnosis test patterns according to the disclosed technology.

FIG. 26 shows a block diagram of an exemplary embodiment of a method 2600 for generating a test pattern for detecting a fast-to-rise fault. The technique shown in FIG. 26 can be modified for other transition faults. At 2610 the load values of scan cells N, N−1, N−2, ..., 0 are constrained to a constant value. In some cases, the constant value is "1" for detecting a fast-to-fall fault or "0" for detecting a fast-to-rise fault. At 2612 the scan cell N is masked by setting it to an unknown value X for each capture cycle except for a last capture cycle. At 2614 a test pattern is generated, with two or more capture cycles, to capture "0" into the data input of the scan cell N−1 and "1" into the data input of the scan cell N. In at least some embodiments, the constraints at 2610 and 2612 cause the values captured by scan cell N−1 and scan cell N to be valid, even if the fault is at scan cell N. So, if scan cell N is faulty, the value "0" on scan cell N−1 is shifted out and "0" appears on scan cell N−1 after unloading. If scan cell N−1 or any of its downstream cells is faulty, the value "0" on scan cell N−1 will be corrupted during scan unload and "1" appears on cell N−1 after unloading. Accordingly, the method 2600 can be used to generate a pattern that differentiates scan cell N from the scan cells downstream of it.

Pseudocode for an exemplary embodiment of the method 2600 appears in Table 15 below:

TABLE 15

Exemplary pseudocode for a targeting a scan cell N with one or more capture cycles for diagnosing a timing fault Extended_Test_Gen_for_Fast-to-rise(N, fast-to-rise)
• Constrain scan load values of scan cells N, N−1, N−2, ..., 0 to a constant value '1' or '0'.
• Mask scan cell N by setting it to unknown value X for all capture cycles but the last capture cycle.
• Generate a test pattern with single and when necessary multiple capture cycles, to capture value '0' into data input of scan cell N−1 and value '1' into data input of scan cell N.

Figure 27:
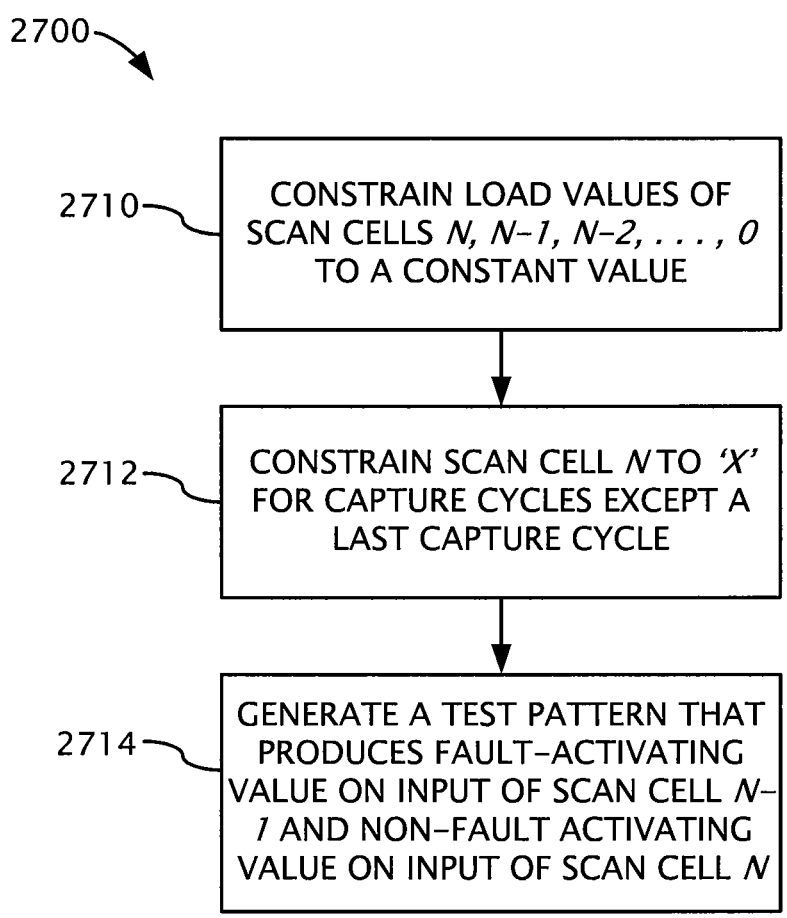
FIG. 27 is a flow chart of a more generalized test pattern generation method than the method shown in FIG. 26.

The exemplary methods introduced above assume that there are no inversions or only an even number of inversions between scan cells of the faulty scan chain. For situations where odd numbers of inversions are present in the scan chain, the methods can be modified to account for the inversions. FIG. 27 shows an exemplary embodiment of a method 2700 that is a more general version of the method 2600 and that is suitable for situations where inversions are desirably accounted for. At 2710 the load values of scan cells N, N−1, N−2, ..., 0 are constrained to a constant value ("1" or "0", depending, for example, on the type of fault and the number of inversions between the scan cell and the scan chain output). At 2712 the scan cell N is masked by setting it to an unknown value X for each capture cycle except for a last capture cycle. At 2714 a test pattern is generated, with two or more capture cycles, to capture a fault-activating value into the data input of the scan cell N−1 and a non-fault-activating value into the data input of the scan cell N. In at least some embodiments, the constraints at 2710 and 2712 cause the values captured by scan cell N−1 and scan cell N to be valid, even if the fault is at scan cell N. So, if scan cell N is faulty, the value "0" on scan cell N−1 is shifted out and "0" appears on scan cell N−1 after unloading. If scan cell N−1 or any of its downstream cells is faulty, the value "0" on scan cell N−1 will be corrupted during scan unload and the value "1" on cell N−1 will be seen after unloading. Accordingly, the method 2700 can be used to generate a pattern that differentiates scan cell N from the scan cells downstream of it.

X. Diagnostic ATPG Flow Using Multi-Capture-Cycle Patterns

Figure 28:
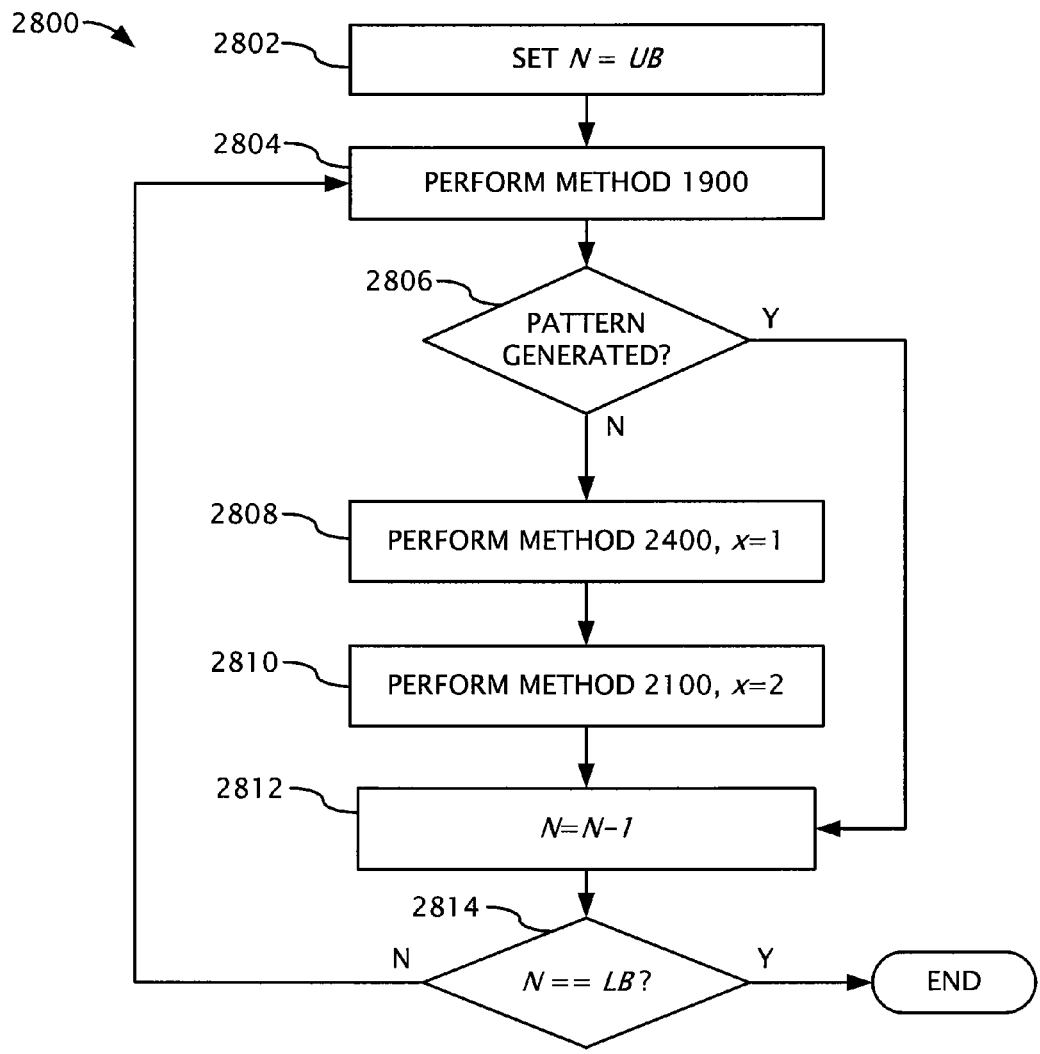
FIG. 28 is a block diagram of a method for generating a set of test patterns.

FIG. 28 shows an exemplary embodiment of an overall diagnostic test generation method 2800 that incorporates embodiments of at least some procedures discussed herein. The method 2800 starts with an upper-bound scan cell (UB) and progresses incrementally toward a lower-bound scan cell (LB), though in other embodiments the targeted scan cell is selected in a different order. For each target scan cell N, the exemplary flow 2800 calls the method 1900 (e.g., Test_Gen_For_Target_Cell_Input(N, stuck-at-v)) to differentiate the cell N from its downstream scan cells. In case the method 1900 fails to create a test pattern for the cell N, the exemplary flow calls the test generation procedures 2100 and 2400 to generate test patterns for the scan cell N. For example, in the particular embodiment illustrated, the method 2400 is used to differentiate scan cell N from scan cell N−1, while the method 2100 is used to differentiate cell N from cells N−2, . . . , 0.

In the particular implementation shown in FIG. 28, at 2802 the target index N is set to the upper-bound scan cell UB. At 2804, the method 1900 is performed for the scan cell N. At 2806, a determination is made as to whether a pattern was generated for the scan cell N. In some embodiments, the method 280d is performed until a time limit (e.g., a CPU time limit), a back-tracking limit, or a memory usage limit (any of which can be preset or user defined) is met. If the limit is exceeded, the determination is made at 2800 that a pattern could not be generated using the method 1900. If a pattern is generated, the target index N is decremented by one at 2818. If a pattern is not generated using the method 1900, the method 2400 is performed at 2808 to differentiate the scan cell N from the scan cell N−1. For example, the procedure Pair_Diff_Through_Cell_Output(N, N−x, stuck-at-v), with x=1, can be called. At 2810 the method 2100 is performed to differentiate the scan cell N from scan cells downstream of N−1. For example, the procedure Extended_Test_Gen_for_Cell_Input (N, N−x, stuck-at-v), with x=2, can be called. In at least some cases, if no pattern is generated after 2810 and 2812, the scan cell N cannot be distinguished from its downstream scan cells. In any case, the value N is decremented at 2812. At 2814, if the target index N is at the lower bound LB, then the method 2800 terminates. Otherwise, the method 2800 returns to 2804 to generate a pattern for the next scan cell in the scan cell range.

In particular embodiments, one or more of the methods described above for generating multi-cycle capture patterns are used with embedded compression techniques (e.g., EDT techniques). In some cases, one or more of the methods described above are used with an EDT design similar to that shown in FIG. 9.

XI. Experimental Results Using Multi-Capture-Cycle Patterns

Embodiments of test generation methods described herein were applied to three circuit designs. Table 16 below describes these three designs.

TABLE 16

Profile of test circuit designs

| Circuit Designs | #gates | #chains | chain length |
|---|---|---|---|
| Circuit D | 10K | 2 | 251 |
| Circuit E | 10K | 3 | 152 |
| Circuit F | 10M | 83 | 11346 |

For each of Circuits D, E and F, single stuck-at faults were injected into randomly selected scan cells of the designs. Using production test patterns, fail logs were obtained for each design. This produced 50 test cases having a diagnostic resolution of more than three suspect scan cells. For comparison purposes, diagnostic patterns were generated for these 50 test cases using (1) the methods 500, 700 and (2) the methods 1900, 2100, 2400.

For 34 of the 50 test cases, the methods 500, 700 and the methods 1900, 2100, 2400 were able to generate patterns that achieved diagnostic resolution of three or fewer suspect scan cells. For the remaining 16 cases, the methods 500, 700 failed to achieve a diagnostic resolution of three or fewer suspect scan cells. These 16 cases are shown below for Circuits D, E and F in Tables 17, 18 and 19, respectively. In these tables, for each case handled by the respective groups of methods, "#OrigSus" is the number of suspects in the case, "#P" is the number of patterns generated by each respective group of methods, and "#Sus" is the diagnostic resolution (i.e., the number of suspect scan cells) identified by applying patterns generated by each respective group of methods. For the methods 1900, 2100, 2400, "Time" is the test generation time (in seconds) used by each group of methods to generate the patterns for a case, and "Depth" is the maximum sequential depth (in cycles) of the generated test patterns. In the depicted results, the sequential depths are either the same as those calculated by the SCOAP algorithm referred to above, or they are at most 2 cycles larger than those calculated by the SCOAP algorithm.

TABLE 17

Diagnostic test pattern generation for Circuit D

| | | Methods 500, 700 | | Methods 1900, 2100, 2400 | | | |
|---|---|---|---|---|---|---|---|
| Case | #OrigSus | #P | #Sus | #P | #Sus | Time | Depth |
| 1 | 18 | 0 | 18 | 17 | 1 | 11 | 4 |
| 2 | 9 | 0 | 9 | 9 | 1 | 212 | 4 |
| 3 | 7 | 0 | 7 | 6 | 1 | 10 | 6 |
| 4 | 5 | 1 | 4 | 2 | 3 | 222 | 7 |
| 5 | 9 | 0 | 9 | 9 | 1 | 163 | 4 |
| 6 | 9 | 0 | 9 | 8 | 1 | 27 | 4 |
| 7 | 31 | 0 | 31 | 30 | 1 | 16 | 4 |

TABLE 18

Diagnostic test pattern generation for Circuit E

| | | Methods 500, 700 | | Methods 1900, 2100, 2400 | | | |
|---|---|---|---|---|---|---|---|
| Case | #OrigSus | #P | #Sus | #P | #Sus | Time | Depth |
| 1 | 12 | 0 | 12 | 11 | 1 | 10 | 4 |
| 2 | 7 | 0 | 7 | 6 | 1 | 1 | 2 |
| 3 | 12 | 0 | 12 | 11 | 1 | 11 | 4 |
| 4 | 4 | 0 | 4 | 3 | 1 | 1 | 4 |

TABLE 19

Diagnostic test pattern generation for Circuit F

| | | Methods 500, 700 | | Methods 1900, 2100, 2400 | | | |
|---|---|---|---|---|---|---|---|
| Case | #OrigSus | #P | #Sus | #P | #Sus | Time | Depth |
| 1 | 7 | 0 | 7 | 6 | 1 | 1054 | 3 |
| 2 | 5 | 0 | 5 | 4 | 1 | 1150 | 4 |
| 3 | 10 | 0 | 10 | 10 | 1 | 7947 | 5 |
| 4 | 11 | 0 | 11 | 10 | 1 | 5120 | 5 |
| 5 | 11 | 0 | 11 | 10 | 1 | 3051 | 5 |

From the results shown in Tables 17-19, it can be seen that in all cases the methods 1900, 2100, 2400 improved the diagnostic resolution to three or fewer scan cells, where the methods 500, 700 did not. In each of these cases, the suspect scan cells identified by the methods 1900, 2100, 2400 contained an actual defective scan cell.

More particularly, the method 1900 successfully identified every defective scan cell in a suspected range of cells for 3 out of 7 cases for Circuit D, for all of the cases for Circuit E, and for 4 out of 5 cases for Circuit F. Accordingly, in at least some cases the method 1900 improves the success rate of generating a test pattern that allows for differentiating a target scan cell from its downstream scan cell. Generally, in cases where the method 1900 can successfully target each scan cell in a suspected range of cells, methods 2100, 2400 are not needed.

In case 2 of Circuit D, the diagnosis produced based on the original production patterns reported 9 suspects. The methods 500, 700 generated no patterns and so did not reduce the number of suspects. The method 1900 successfully generated 7 patterns, one pattern each for 7 of the 9 scan cells and failed to generate a pattern for one scan cell. The methods 2100, 2400 each generated a pattern for this remaining scan cell, for a total of 9 patterns. These patterns allowed the number of suspects for this case to be reduced to one scan cell (i.e., the defective cell).

XII. Exemplary Computing Environments

Figure 29:
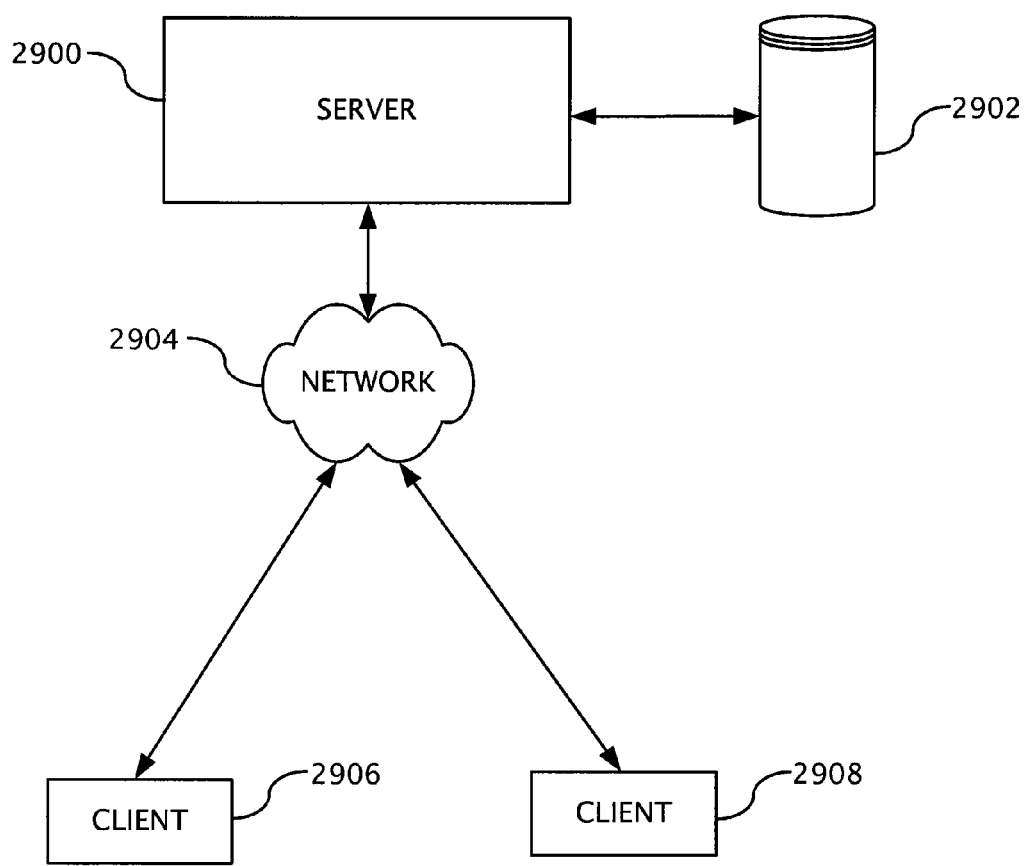
FIG. 29 is a schematic block diagram of a first distributed computing network that can be used to generate test patterns according to the disclosed technology.

Any aspects of the technologies described above may be performed using a distributed computer network. FIG. 29 shows one suitable exemplary network. A server computer 2900 can have an associated storage device 2902 (internal or external to the server computer). The server computer 2900 can be configured to generate chain diagnosis test patterns or to perform scan chain diagnosis using any of the disclosed methods (for example, as part of an EDA software tool, such as a test pattern generation tool). The server computer 2900 can be coupled to a network, shown generally at 2904, which can comprise, for example, a wide-area network, a local-area network, a client-server network, the Internet, or other suitable network. One or more client computers, such as those shown at 2906, 2908, may be coupled to the network 2904 using a network protocol. The work may also be performed on a single, dedicated workstation, which has its own memory and one or more CPUs.

Figure 30:
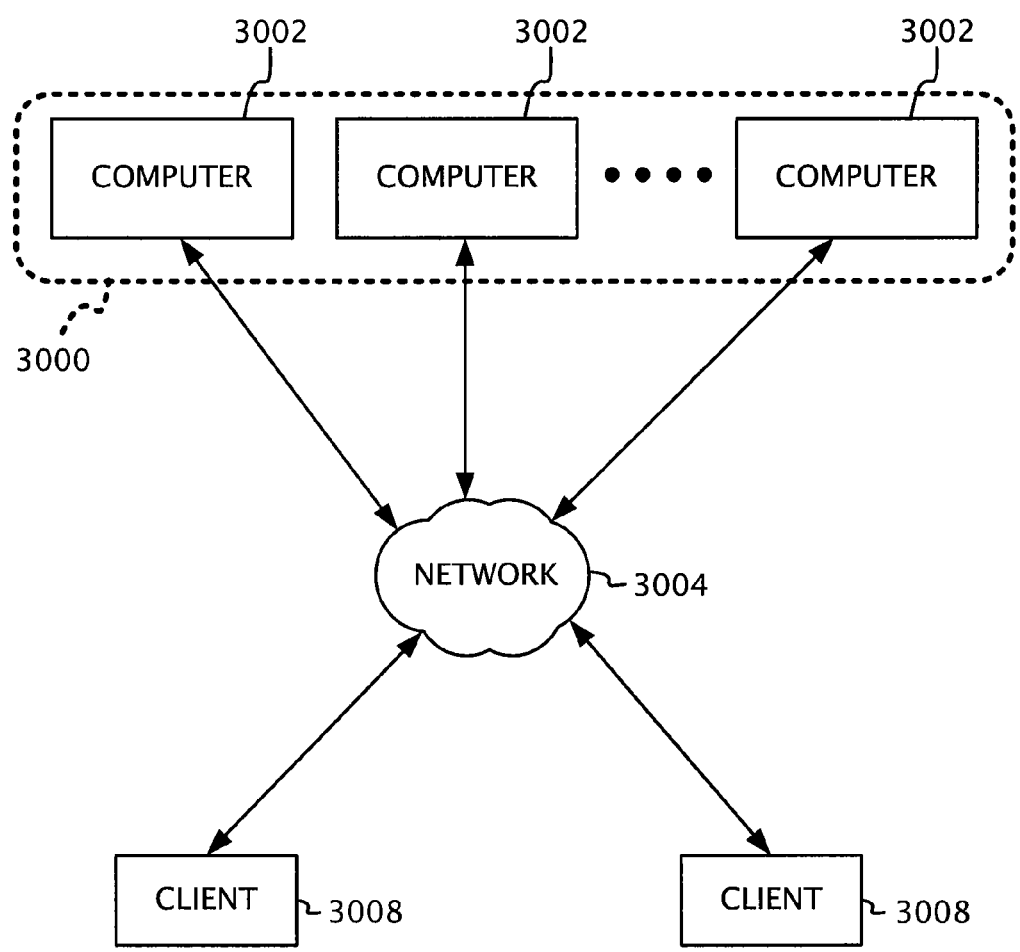
FIG. 30 is a schematic block diagram of a second distributed computing network that can be used to generate test patterns according to the disclosed technology.

FIG. 30 shows another exemplary network. One or more computers 3002 communicate via a network 3004 and form a computing environment 3000 (for example, a distributed computing environment). Each of the computers 3002 in the computing environment 3000 can be used to perform at least a portion of the chain diagnosis test pattern generation process. The network 3004 in the illustrated embodiment is also coupled to one or more client computers 3008.

Figure 31:
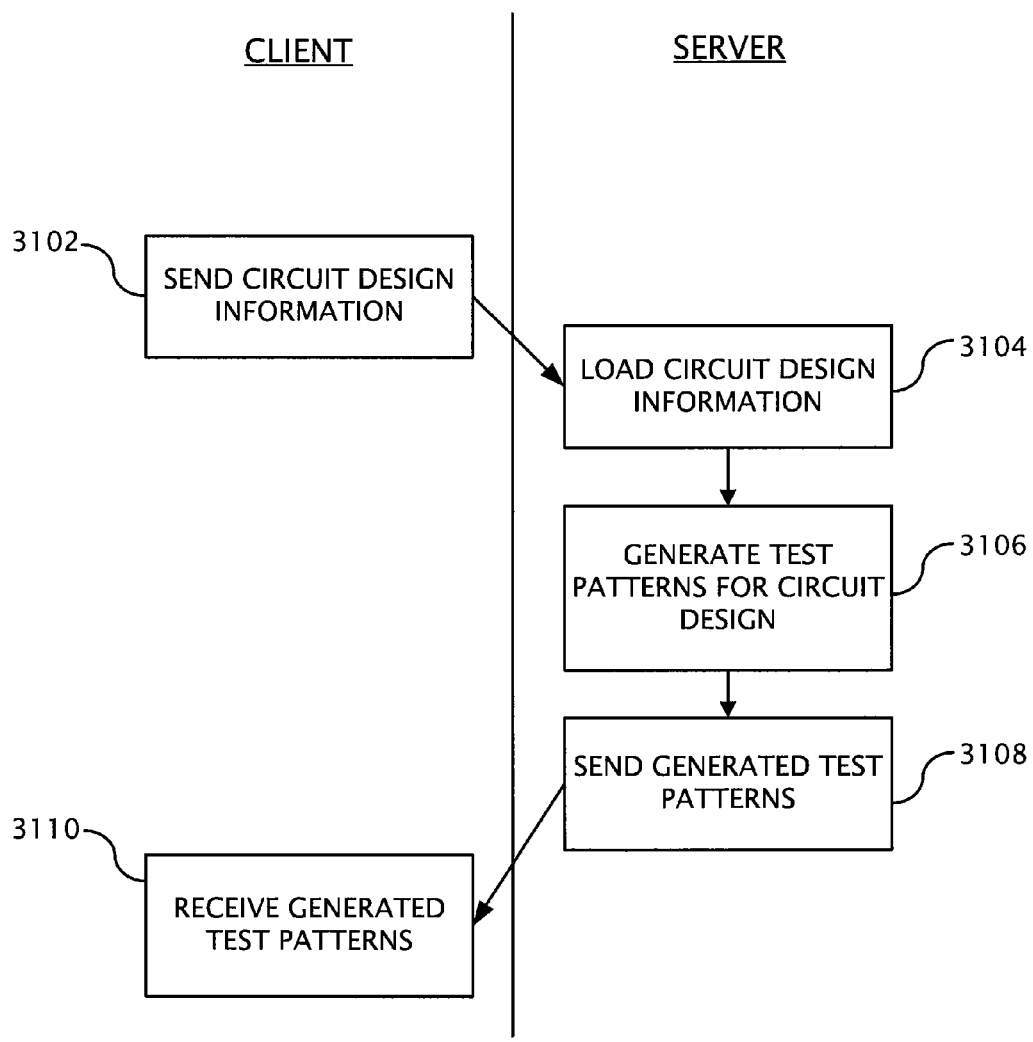
FIG. 31 is a flowchart of a method for producing test patterns using a distributed computing networks, such as the networks of FIGS. 29 and 30.

FIG. 31 shows that design information for a circuit-under-test (for example, an HDL file, netlist, GDSII file, Oasis file, or other suitable design file representing the circuit-under-test together with its scan chains) can be analyzed using a remote server computer (such as the server computer 2900 shown in FIG. 29) or a remote computing environment (such as the computing environment 3000 shown in FIG. 30) in order to generate chain diagnosis test patterns according to any embodiment of the disclosed technology. At process block 3102, for example, the client computer sends the integrated circuit design information to the remote server or computing environment. In process block 3104, the integrated circuit design information is received and loaded by the remote server or by respective components of the remote computing environment. In process block 3106, chain diagnosis test pattern generation is performed to produce chain diagnosis test patterns according to any of the disclosed embodiments. At process block 3108, the remote server or computing environment sends the resulting test patterns to the client computer, which receives the data at process block 3110.

It should be apparent to those skilled in the art that the example shown in FIG. 31 is not the only way to generate test patterns using multiple computers. For instance, the circuit-under-test design information may be stored on a computer-readable medium that is not on a network and that is sent separately to the server or computing environment (for example, a CD-ROM, DVD, or portable hard drive). Or, the server computer or remote computing environment may perform only a portion of the test pattern generation procedure.

Scan chain diagnosis can similarly be performed in a distributed computer environment, such as by using a remote server computer (such as the server computer 2900 shown in FIG. 29) or a remote computing environment (such as the computing environment 3000 shown in FIG. 30). For example, test responses from circuit testing with the chain diagnosis test patterns can be analyzed and diagnosed using such remote server computers or computing environments.

Figure 32:
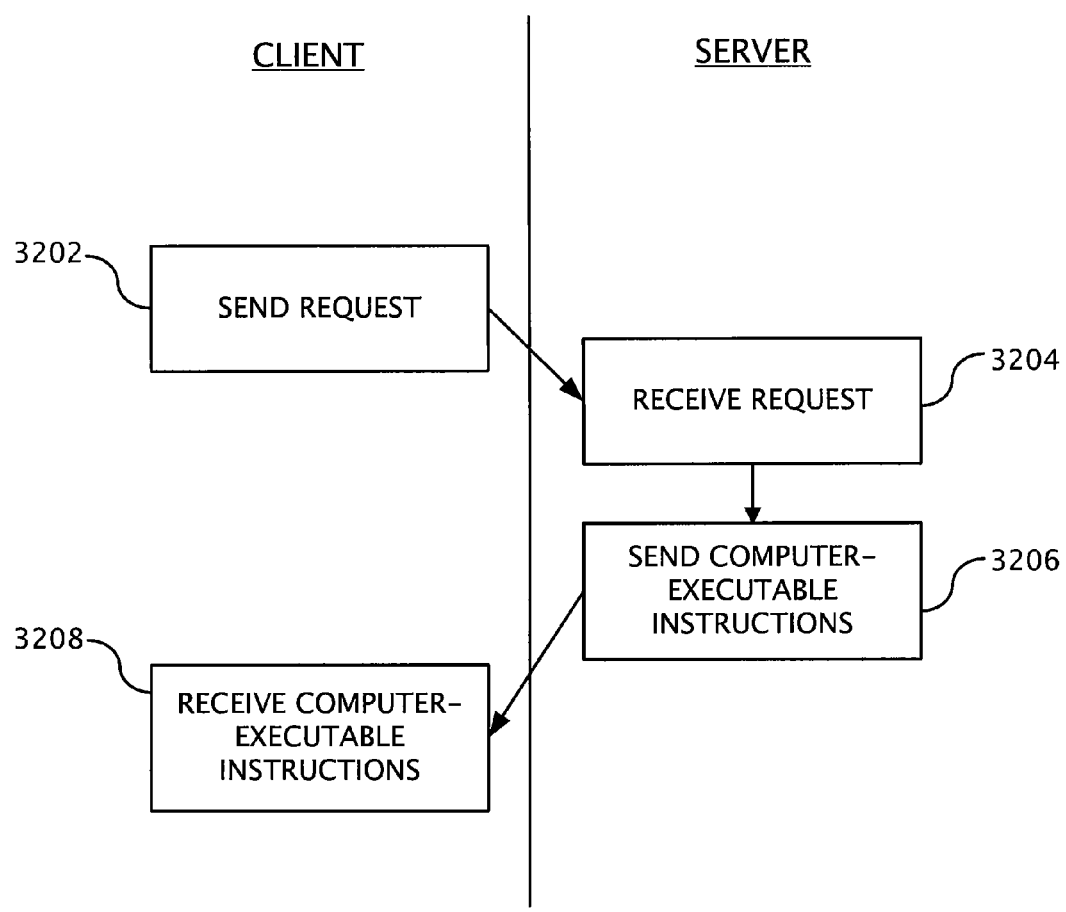
FIG. 32 is a block diagram illustrating how the computer networks of FIGS. 29 and 30 can be used to transmit computer-executable instructions for causing a computer to perform any of the disclosed method.

FIG. 32 shows one exemplary manner in which computer-executable instructions for performing any of the disclosed embodiments can be transmitted, accessed, or received using a remote server computer (such as the server computer 2900 shown in FIG. 29) or a remote computing environment (such as the computing environment 3000 shown in FIG. 30). At process block 3202, for example, the client computer sends a request to download computer-executable instructions for performing any of the disclosed methods or techniques (e.g., after purchasing a license to an ATPG and/or scan chain diagnosis tool). In process block 3204, the request is received by the remote server or by respective components of the remote computing environment. In process block 3206, the remote server or computing environment transmits computer-executable instructions for performing any of the disclosed methods or techniques (e.g., computer-executable instructions for implementing any of the test pattern generation or scan chain diagnosis embodiments on a computer). At 3208, the computer-executable instructions are received (e.g., stored, buffered, and/or executed) by the client computer.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

We claim:

1. A computer-implemented method comprising:
    generating one or more scan chain test patterns for locating a faulty scan cell in a scan chain in an electronic circuit by, for each respective one of the one or more scan chain test patterns, capturing a fault effect of the faulty scan cell after a plurality of capture cycles.

2. The method of claim 1, further comprising applying at least some of the generated one or more patterns to the electronic circuit to identify a range of one or more scan cell candidates containing the faulty scan cell.

3. The method of claim 1, wherein the faulty scan cell has a stuck-at fault.

4. The method of claim 1, wherein the faulty scan cell has a timing fault.

5. The method of claim 4, wherein the timing fault is one of a slow-to-rise fault, a slow-to-fall fault, a slow fault, a hold-time fault, a fast-to-rise fault, a fast-to-fall fault, and a fast fault.

6. The method of claim 1, wherein a first of the one or more scan chain test patterns is generated according to a first test pattern generation method, and wherein a second of the one or more scan chain test patterns is generated according to a second test pattern generation method.

7. One or more computer-readable storage media storing computer-executable instructions which, when executed by a computer, cause the computer to perform a method, the method comprising:
   generating one or more scan chain test patterns for locating a faulty scan cell in a scan chain in an electronic circuit by, for each respective one of the one or more scan chain test patterns, capturing a fault effect of the faulty scan cell after a plurality of capture cycles.

8. The one or more computer-readable storage media of claim 7, wherein the method further comprises applying at least some of the generated one or more patterns to the electronic circuit to identify a range of one or more scan cell candidates containing the faulty scan cell.

9. The one or more computer-readable storage media of claim 7, wherein the faulty scan cell has a stuck-at fault.

10. The one or more computer-readable storage media of claim 7, wherein the faulty scan cell has a timing fault.

11. The one or more computer-readable storage media of claim 10, wherein the timing fault is one of a slow-to-rise fault, a slow-to-fall fault, a slow fault, a hold-time fault, a fast-to-rise fault, a fast-to-fall fault, and a fast fault.

12. The one or more computer-readable storage media of claim 7, wherein a first of the one or more scan chain test patterns is generated according to a first test pattern generation method, and wherein a second of the one or more scan chain test patterns is generated according to a second test pattern generation method.

13. A system, comprising:
   a memory; and
   a processor programmed to:
     generate one or more scan chain test patterns for locating a faulty scan cell in a scan chain in an electronic circuit by, for each respective one of the one or more scan chain test patterns, capturing a fault effect of the faulty scan cell after a plurality of capture cycles, and
     store the one or more scan chain test patterns in the memory.

* * * * *